(12) United States Patent
Imwalle et al.

(10) Patent No.: US 9,091,496 B2
(45) Date of Patent: Jul. 28, 2015

(54) CONTROLLING DATA CENTER COOLING

(71) Applicant: Google Inc., Mountain View, CA (US)

(72) Inventors: Gregory P. Imwalle, Mountain View, CA (US); Thomas R. Kowalski, Ben Lomond, CA (US); Andrew B. Carlson, Atherton, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/779,159

(22) Filed: Feb. 27, 2013

(65) Prior Publication Data

US 2013/0233532 A1 Sep. 12, 2013

Related U.S. Application Data

(60) Provisional application No. 61/608,290, filed on Mar. 8, 2012.

(51) Int. Cl.
*H05K 7/20* (2006.01)
*F28F 27/02* (2006.01)

(52) U.S. Cl.
CPC .............. *F28F 27/02* (2013.01); *H05K 7/20745* (2013.01); *H05K 7/20836* (2013.01)

(58) Field of Classification Search
USPC ......... 165/287–294, 299, 300; 62/259.2, 150, 62/185, 201
See application file for complete search history.

(56) References Cited

U.S. PATENT DOCUMENTS

| | | | | |
|---|---|---|---|---|
| 4,479,532 A | * | 10/1984 | Watanabe ..................... | 165/291 |
| 4,498,524 A | * | 2/1985 | Jacobsen ...................... | 165/292 |
| 4,615,481 A | * | 10/1986 | Tanaami et al. ................ | 236/38 |
| 5,123,478 A | * | 6/1992 | Hosaka ......................... | 165/292 |
| 5,544,012 A | | 8/1996 | Koike | |
| 5,718,628 A | | 2/1998 | Nakazato et al. | |
| 7,088,585 B2 | | 8/2006 | Chu et al. | |
| 7,365,973 B2 | * | 4/2008 | Rasmussen et al. ......... | 62/259.2 |
| 7,500,911 B2 | | 3/2009 | Johnson et al. | |
| 7,542,285 B2 | | 6/2009 | Colucci et al. | |
| 8,113,010 B2 | * | 2/2012 | Carlson ......................... | 62/259.2 |
| 8,286,442 B2 | * | 10/2012 | Carlson et al. ................ | 62/259.2 |
| 2003/0016498 A1 | * | 1/2003 | Kurokawa et al. ............ | 361/699 |

(Continued)

FOREIGN PATENT DOCUMENTS

| | | |
|---|---|---|
| JP | 2002061911 A | 2/2002 |
| JP | 2005191554 | 7/2005 |

(Continued)

OTHER PUBLICATIONS

Authorized Officer Jin Ho Kim; International Search Report and Written Opinion for PCT/US2013/028027 dated Jun. 10, 2013; 9 pages.

*Primary Examiner* — John Ford
(74) *Attorney, Agent, or Firm* — Fish & Richardson P.C.

(57) ABSTRACT

A data center cooling system includes a data center having electronic equipment that is supported in multiple racks; a cooling fluid source; multiple cooling units in the data center, where each cooling unit is configured to cool air warmed by a sub-set of the electronic equipment in the data center; multiple control valves, including a control valve associated with a particular cooling unit of the cooling units; and a controller arranged to modulate the control valve associated with a particular cooling unit, to open or close the control valve to substantially maintain an approach temperature set point of the particular cooling unit.

34 Claims, 10 Drawing Sheets

(56) References Cited

U.S. PATENT DOCUMENTS

| | | |
|---|---|---|
| 2003/0173688 A1 | 9/2003 | Koo |
| 2003/0221821 A1 | 12/2003 | Patel et al. |
| 2004/0112582 A1 | 6/2004 | Beitelmal et al. |
| 2005/0056023 A1* | 3/2005 | Pierson .......................... 60/772 |
| 2006/0168975 A1 | 8/2006 | Malone et al. |
| 2007/0167125 A1 | 7/2007 | Rasmussen et al. |
| 2008/0029250 A1* | 2/2008 | Carlson et al. ........... 165/104.33 |
| 2008/0198549 A1 | 8/2008 | Rasmussen et al. |
| 2009/0112522 A1 | 4/2009 | Rasmussen |
| 2009/0241578 A1 | 10/2009 | Carlson et al. |
| 2009/0251860 A1 | 10/2009 | Belady et al. |
| 2010/0032142 A1* | 2/2010 | Copeland et al. ........ 165/104.33 |

FOREIGN PATENT DOCUMENTS

| | | |
|---|---|---|
| JP | 2006208000 | 8/2006 |
| JP | 2011129149 A | 6/2011 |

* cited by examiner

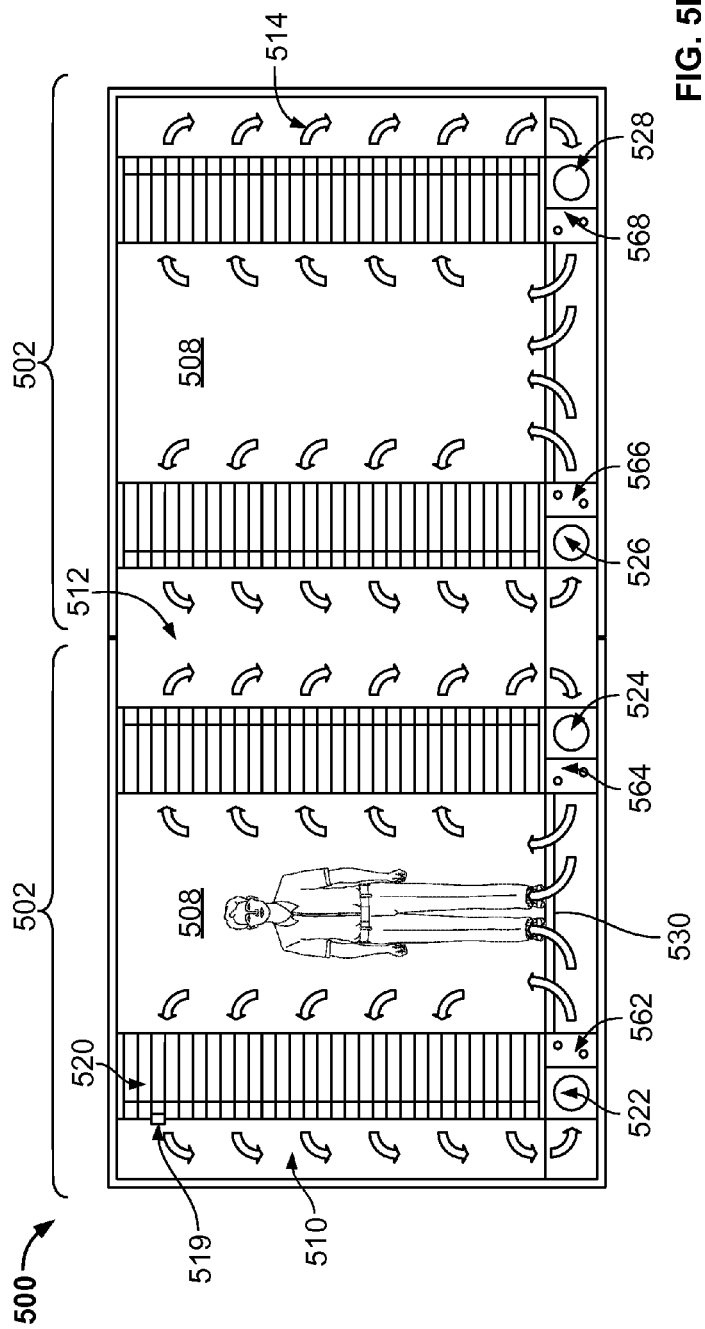
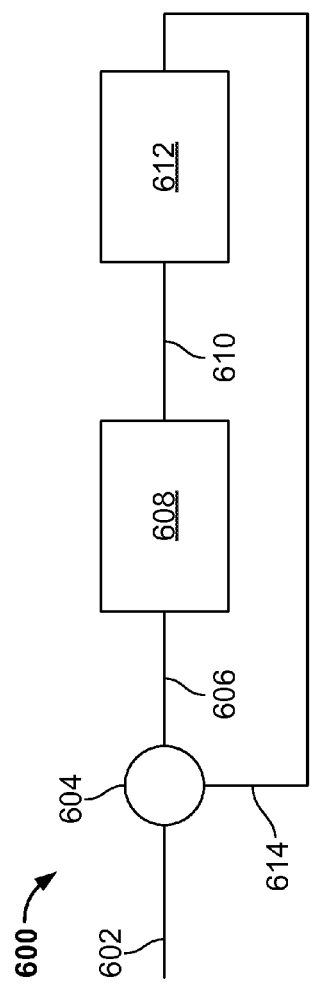

CONTROLLING DATA CENTER COOLING

CLAIM OF PRIORITY

This application claims priority to U.S. Provisional Patent Application Ser. No. 61/608,290, filed on Mar. 8, 2012, the entire contents of which are hereby incorporated by reference.

TECHNICAL BACKGROUND

This disclosure relates to systems and methods for providing cooling for areas that contain electronic equipment, such as computer server rooms and server racks in computer data centers.

BACKGROUND

Computer users often focus on the speed of computer microprocessors (e.g., megahertz and gigahertz). Many forget that this speed often comes with a cost-higher power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. It is much like having a room filled with thousands of burning floodlights. The effects of power consumed by the critical load in the data center are often compounded when one incorporates all of the ancillary equipment required to support the critical load.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in temperature can cause great increases in microprocessor errors and failures. In sum, a data center requires a large amount of electricity to power the critical load, and even more electricity to cool the load.

SUMMARY

This document discusses systems and techniques that can be used to lower the amount of energy needed to cool a computer data center. Specifically, racks in a data center may be cooled by particular corresponding cooling units, such as by circulating air that has been heated by computers into the racks, through cooling coils in the cooling units (and recirculating the air back through the racks). Improved performance may be obtained by controlling the system to a particular set approach temperature for each of the cooling coils, where the approach temperature is a difference between a temperature of an airflow circulated from the coil and a temperature of a cooling fluid source circulated to the coil. The setpoint for the approach temperature may be varied, such as by a central control system that sends setpoint signals to various control valves in the system that are modulated to maintain approach temperatures at their respective cooling units at the setpoints. Such techniques may be used to provide adequate cooling even as ambient conditions (e.g., outdoor air temperatures and dew points that affect the performance of water-side economizer systems) change, and while allowing the output temperature of the cooling units to float with such conditions while still providing adequate cooling.

In one general embodiment, a data center cooling system includes a data center having electronic equipment that is supported in multiple racks; a cooling fluid source; multiple cooling units in the data center, each cooling unit configured to cool air warmed by a sub-set of the electronic equipment in the data center; multiple control valves, including a control valve associated with a particular cooling unit of the cooling units; and a controller arranged to modulate the control valve associated with a particular cooling unit, to open or close the control valve to substantially maintain an approach temperature set point of the particular cooling unit.

In a first aspect combinable with the general embodiment, the approach temperature is defined by a difference between a temperature of an airflow circulated from the cooling unit and a temperature of the cooling fluid source circulated to the cooling unit.

In a second aspect combinable with any of the previous aspects, the controller is arranged to receive a signal adjusting the approach temperature set point.

In a third aspect combinable with any of the previous aspects, the controller is one of multiple controllers, and each of the controllers is associated with one of the cooling units.

In a fourth aspect combinable with any of the previous aspects, the controller is arranged to modulate the control valve to open the control valve based on the controller receiving the signal adjusting the approach temperature set point.

In a fifth aspect combinable with any of the previous aspects, the controller is arranged to modulate the control valves to open the control valves until about 98% of the control valves are about 95% open.

A sixth aspect combinable with any of the previous aspects further includes an airflow temperature sensor arranged to measure the temperature of the airflow as it leaves the particular cooling unit.

A seventh aspect combinable with any of the previous aspects further includes a fluid temperature sensor arranged to measure a temperature of the cooling fluid source as it enters the particular cooling unit.

In an eighth aspect combinable with any of the previous aspects, the particular cooling unit includes one or more cooling coils that receive the circulating cooling fluid.

In a ninth aspect combinable with any of the previous aspects, each cooling unit includes one or more fans arranged to circulate air from an ambient workspace adjacent a row of racks, through front sides of the racks open to the workspace, through back sides of the racks opposite the front sides, and to the cooling unit.

In a tenth aspect combinable with any of the previous aspects, the one or more fans are arranged to circulate the air through the racks to receive heat generated by the electronic equipment.

In an eleventh aspect combinable with any of the previous aspects, the one or more fans are arranged to circulate the heated air through the cooling coils to transfer the heat generated by the electronic equipment to the circulating cooling fluid and to expel the air to the ambient workspace.

In a twelfth aspect combinable with any of the previous aspects, the one or more fans of the particular cooling unit are arranged to circulate air from the ambient workspace through the front sides of at least two adjacent racks in the row of racks, through the back sides of the two racks opposite the front sides, and to the particular cooling unit.

A thirteenth aspect combinable with any of the previous aspects further includes a fan controller arranged to vary a speed of the one or more fans in response to the signal adjusting the approach temperature set point.

In a fourteenth aspect combinable with any of the previous aspects, the racks are in rows, and the cooling units are positioned on a support floor of the data center between pairs of adjacent rows.

In a fifteenth aspect combinable with any of the previous aspects, the signal to adjust approach temperature is based on an amount of cooling fluid flow that is required to meet a cooling load in the data center.

In a sixteenth aspect combinable with any of the previous aspects, the signal to adjust approach temperature is based on an aggregate amount of cooling fluid circulated to the cooling units.

In a seventeenth aspect combinable with any of the previous aspects, the controller is configured to decrease the approach temperature set point based on the aggregate amount of cooling fluid below a threshold amount, and increase the approach temperature set point based on the aggregate amount above a threshold amount.

In an eighteenth aspect combinable with any of the previous aspects, each control valve associated with a cooling unit of the cooling units is modulated to maintain a unique approach temperature set point associated with the cooling unit.

In a nineteenth aspect combinable with any of the previous aspects, each cooling unit includes a liquid-to-liquid heat exchanger including a working fluid in heat transfer communication with the cooling fluid source.

In a twentieth aspect combinable with any of the previous aspects, the working fluid is operable to cool air warmed by the sub-set of the electronic equipment in the data center.

In another general embodiment, a method for cooling a data center includes circulating a cooling fluid to multiple cooling units in a data center that contains electronic equipment that is supported in multiple racks; circulating air from an ambient workspace that is adjacent the racks across a sub-set of the electronic equipment that is supported in the racks, through a particular cooling unit of the cooling units, and from the particular cooling unit to the ambient workspace; determining a temperature of the air leaving the particular cooling unit; determining a temperature of the cooling fluid circulated to the particular cooling unit; and modifying a flow rate of the cooling fluid circulated to the particular cooling unit to maintain an approach temperature set point of the particular cooling unit.

In a first aspect combinable with the general embodiment, the approach temperature is defined using a difference between the temperature of the air leaving the particular cooling unit and the temperature of the cooling fluid circulated to the particular cooling unit.

A second aspect combinable with any of the previous aspects further includes modulating the flow rate of the cooling fluid circulated to the particular cooling unit based on a change in the approach temperature set point that is received from a control system.

In a third aspect combinable with any of the previous aspects, modulating the flow rate of the cooling fluid circulated to the particular cooling unit includes modulating a control valve associated with the particular cooling unit to open or close the control valve with a controller.

A fourth aspect combinable with any of the previous aspects further includes receiving a signal at the controller that represents the change in the approach temperature set point.

A fifth aspect combinable with any of the previous aspects further includes modulating multiple control valves associated with the cooling units to open the control valves until about 98% of the control valves are about 95% open.

A sixth aspect combinable with any of the previous aspects further includes circulating air warmed by the sub-set of electronic equipment through one or more cooling coils of the particular cooling unit.

A seventh aspect combinable with any of the previous aspects further includes circulating cool air from the one or more cooling coils to the ambient workspace.

An eighth aspect combinable with any of the previous aspects further includes varying a rate of the air circulated from the particular cooling unit to the ambient workspace in response to the change in the approach temperature set point.

A ninth aspect combinable with any of the previous aspects further includes determining a cooling load of the data center.

A tenth aspect combinable with any of the previous aspects further includes adjusting the approach temperature set point to meet the cooling load in the data center.

In an eleventh aspect combinable with any of the previous aspects, the signal to adjust approach temperature is based on an aggregate amount of cooling fluid circulated to the cooling units.

In a twelfth aspect combinable with any of the previous aspects, the controller is configured to decrease the approach temperature set point based on the aggregate amount below a threshold amount, and increase the approach temperature set point based on the aggregate amount above a threshold amount.

In a thirteenth aspect combinable with any of the previous aspects, each control valve associated with a cooling unit of the cooling units is modulated to maintain a unique approach temperature set point associated with the cooling unit.

In another general embodiment, a data center cooling system includes a computer rack that supports multiple heat-generating devices; a fan coil unit arranged adjacent to the computer rack; a control valve configured to control a volumetric flow of cooling fluid circulated to the cooling coil; and a unit controller communicably coupled to the control valve. The fan coil includes at least one fan arranged to circulate air from an open front side of the computer rack adjacent a human-occupiable workspace through the rack and to an open back side of the computer rack adjacent the fan coil unit, and at least one cooling coil adjacent the open back side of the computer rack and arranged to receive heated air circulated from the computer rack and cool the heated air. The controller is configured to modulate the valve to meet an approach temperature set point of the fan coil unit.

In a first aspect combinable with the general embodiment, an approach temperature is a difference between a leaving air temperature of the fan coil unit and an entering cooling fluid temperature of the fan coil unit.

In a second aspect combinable with any of the previous aspects, the approach temperature set point is varied based on an open percentage of the modulating valve.

A third aspect combinable with any of the previous aspects further includes a main controller communicably coupled to the unit controller.

In a fourth aspect combinable with any of the previous aspects, the main controller is operable to receive a signal representative of the open percentage of the control valve, and in response to the signal, transmit a command to the unit controller to vary the approach temperature set point.

In a fifth aspect combinable with any of the previous aspects, the main controller is operable to determine an available amount of the cooling fluid from a central cooling plant.

In a sixth aspect combinable with any of the previous aspects, the main controller is operable, based on the determined available amount and the signal representative of the open percentage of the control valve, to transmit a second command to the unit controller to vary the approach temperature set point.

In a seventh aspect combinable with any of the previous aspects, the main controller is operable to compare the signal representative of the open percentage of the control valve to a predetermined percentage.

In an eighth aspect combinable with any of the previous aspects, the main controller is operable, based on a variance in the signal and the predetermined percentage, to transmit a second command to the unit controller to vary the approach temperature set point.

In a ninth aspect combinable with any of the previous aspects, the main controller is operable to compare multiple signals representative of open percentages of multiple control valves to a predetermined percentage.

In a tenth aspect combinable with any of the previous aspects, the main controller is operable, based on a variance between an aggregation of the signals and the predetermined percentage, to transmit a second command to the unit controller to vary the approach temperature set point.

Various embodiments of systems and methods for providing cooling for areas containing electronic equipment may include one or more of the following advantages. For example, a cooling apparatus operable to cool a data center may implement a static approach control scheme to apply a single, fixed value for an approach temperature set point to all (or most) cooling apparatus in the data center. The cooling apparatus may be controlled to maintain the approach temperature set point (i.e., a difference in temperature between airflow leaving the apparatus and fluid entering the apparatus) rather than, for instance, simply a leaving air temperature from the apparatus. The cooling apparatus may allocate cooling fluid (e.g., from a central plant or other cooling facility) to follow a data center cooling load based solely on information available locally at each cooling apparatus. The cooling apparatus can thus be controlled so that a temperature in the data center may follow the seasons in accordance with weather impact on cooling plant capacity (e.g., by maximizing free cooling opportunities). In addition, embodiments of systems and methods for providing cooling for areas containing electronic equipment may provide for a dynamic approach temperature control (e.g., approach temperature set point for one or more cooling apparatus may vary over time). For example, multiple cooling apparatuses may be controlled based on one or more approach temperature set points in order to, for instance, track a cooling load in the data center that varies spatially and temporally. In some embodiments, an available capacity of cooling fluid from a central cooling plant can be more optimally deployed.

Further, the cooling load may be handled by the cooling apparatus in response to such factors as, for example, the types of electronic devices deployed at various locations on the data center floor; the types of services executed by such devices; an actual aggregate heat load on the data center floor; and an actual cooling system capacity under current weather conditions. Further, by dynamically varying the approach temperature, oversubscription (e.g., design of a cooling system with more cooling fluid available than used) of a cooling fluid supply may be diminished. As another example, utilizing a master controller to dynamically vary the approach temperature may allow for using more cooling fluid only when the chillers won't be engaged in order to reduce central cooling plant operational expenses.

These general and specific aspects may be implemented using a device, system or method, or any combinations of devices, systems, or methods. The details of one or more implementations are set forth in the accompanying drawings and the description below. Other features, objects, and advantages will be apparent from the description and drawings, and from the claims.

DESCRIPTION OF DRAWINGS

FIGS. 5A-5B show plan and sectional views, respectively, of a modular data center system;

FIG. 6 illustrates an example control loop for controlling a data center cooling apparatus;

DETAILED DESCRIPTION

This disclosure relates to systems and methods for providing cooling for areas that contain electronic equipment, such as computer server rooms and server racks in computer data centers. For example, in some example embodiments, a cooling apparatus may be controlled to maintain a static or dynamic approach temperature that is defined by a difference between a leaving air temperature of the cooling apparatus and an entering cooling fluid temperature of the cooling apparatus. For example, in some embodiments, a data center cooling system may include multiple cooling units that are arranged to provide cool air to rack-mounted electronic equipment. One or more control valves can be in fluid communication with the cooling units to circulate the cooling fluid to the cooling units. One or more controllers (which may be centrally located or distributed) can in turn be communicably coupled to the control valves to modulate the valves to maintain the approach temperature set point. In some embodiments, the controller(s) may modulate the control valves based on a change to the approach temperature set point. In other words, the setpoint for a sub-system controlled by a particular valve may be an approach temperature, and such temperature can be computed as a difference in air temperature sensed by a temperature sensor at or near an exit of a cooling unit, and a water temperature at or near an input to a cooling coil in the cooling unit. (The particular location may vary as long as it sufficiently approximates the relevant temperatures so that proper cooling according to an approach temperature scheme can be maintained.) The setpoint can then be changed by the system, and the control valve may then be controlled to maintain the new setpoint temperature.

Figure 1A:
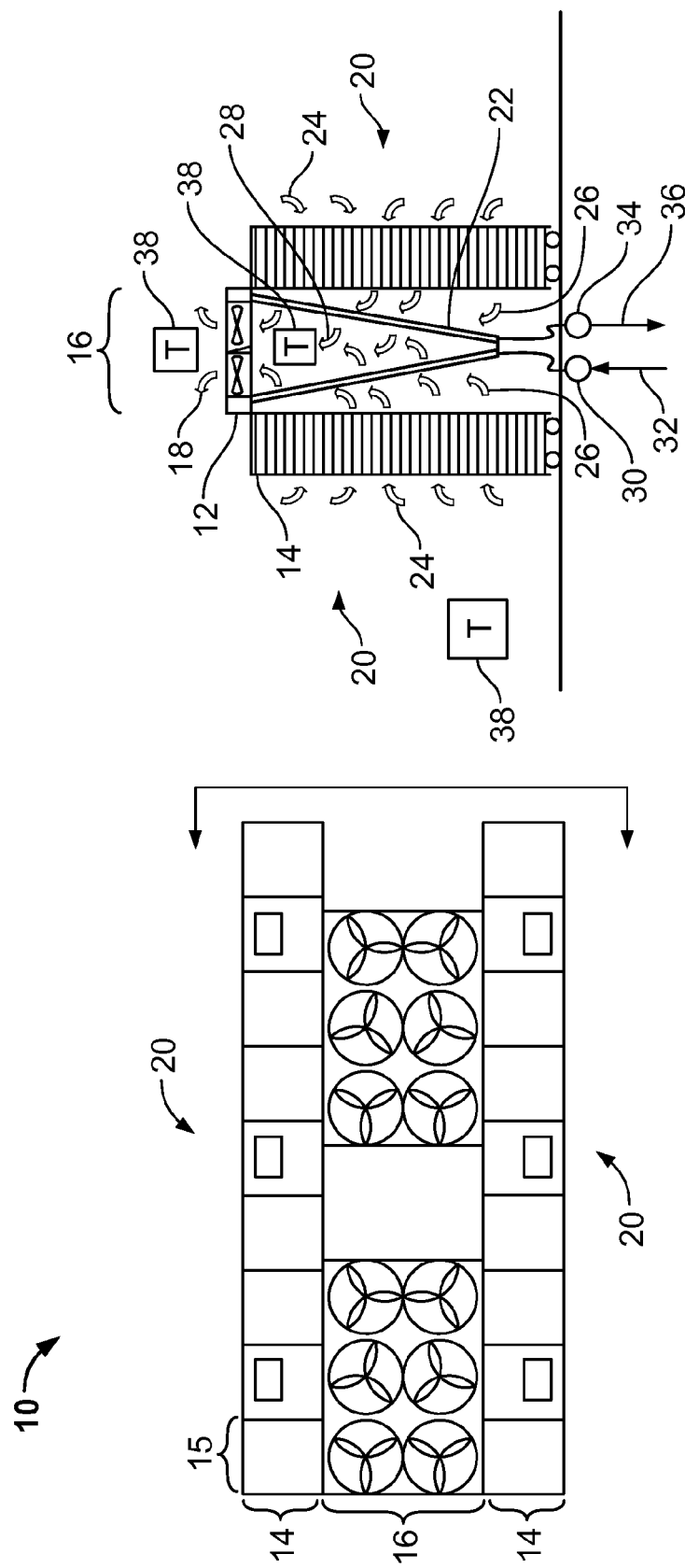
FIG. 1A illustrates a top and side view of an example embodiment of a portion of a data center including a data center cooling apparatus.

FIG. 1A illustrates a top and side view of an example embodiment of a portion of a data center 10 that includes a data center cooling apparatus 16. As illustrated, the data center 10 includes one or more rows 14 of computers that are supported in racks 15. The rows 14 are arranged substantially parallel with each other, and are each adjacent to aisles in a human-occupiable workspace 20. The computers that are supported in the racks 15, in some embodiments, may be open to the human-occupiable workspace 20 such that an airflow may be circulated from the workspace 20 through the racks 16 during normal operation of the system, and so that technicians may access particular devices without having to substantially interfere with airflow over the other devices (such as would happen if the rack were sealed and the technician had to open a door to access one of the devices).

Data center 10 also includes one or more cooling units 16 arranged between adjacent pairs of the rows 14 of racks 15. The cooling units 16 are modular (and each is of like size), and the rows of racks "back up to" the cooling units 16 so that warmed air from the racks passes directly into the cooling units 16. As illustrated, each cooling unit 16 includes a number of fans 12 (e.g., six as illustrated) that are arranged to circulate air from the workspace 20, through the racks 15 arranged in the rows 14. As illustrated, the ambient air 24 is circulated through the racks 15 and heated by heat generating electronic devices (e.g., servers, processors, uninterruptible power supplies, and other devices) into heated airflow 26. The heated airflow 26 is circulated through one or more cooling coils 22 of the cooling unit 16 to a cooling airflow 28. The cooling airflow 28 is then circulated by the fans 12 to the workspace 20 as a leaving airflow 18 from the cooling units 16. In some embodiments, a temperature of the cooling airflow 28 and the leaving airflow 18 may be substantially the same (e.g., where there is no electrical equipment or mixing with other air between the two). In some embodiments, alternatively, the leaving airflow 18 may be slightly warmer than the cooling airflow 28 to account for, e.g., motor heat from fan motors (not shown) that drive the fans 12.

As illustrated, therefore, a volume defined between two substantially parallel rows 14 of racks 15 into which one or more cooling units 16 may be disposed may include one or more warm air plenums and one or more cool air plenums. For example, the warm air plenums may be defined by spaces into which the heated airflows 26 are circulated by the fans 12. The cool air plenums may be defined by spaces into which the cooling airflow 28 is circulated. Thus the cooling coils 22 may thermally separate the warm air plenums from the cool air plenums between the rows 14 of racks 15.

As illustrated, a cooling fluid supply 32 (e.g., chilled water, chilled glycol, condenser water, and/or a mix of one or more fluid flows) is circulated (e.g., pumped) to the cooling coils 22 through a cooling fluid supply conduit 30. After circulating through the cooling coils 22 so that heat from the heated airflow 26 is transferred to the cooling fluid supply 32, cooling fluid return 36 (i.e., the cooling fluid supply 32 leaving the cooling coils 22) is circulated from the cooling coils 22 and, for example, to a central cooling facility, via a cooling fluid return conduit 36. Although illustrated as arranged underneath a floor on which the rows 14 of racks 15 and the cooling units 16 are supported, the conduits 32 and/or 36 may be arranged in the workspace 20, above the cooling units 16, and/or in a separate overhead plenum.

The illustrated system also includes one or more temperature sensors 38. For example, as illustrated, a temperature sensor 38 may be positioned in one or more locations to measure the temperature of the leaving airflow 18 from the cooling units 16. In some embodiments, a temperature of the cooling airflow 28, the leaving airflow 18, and the ambient airflow 24 of the workspace 20 may be substantially similar and/or equal. Thus, measuring any one of the temperatures of these airflows may at least approximate a leaving air temperature of the cooling units 16.

In operation, the cooling units 16 may be controlled (e.g., via one or more individual controllers and/or a main controller in the data center) to maintain a specified approach temperature. The approach temperature, in some embodiments, may represent a difference between a temperature of an airflow leaving the cooling unit 16 (e.g., the cooling airflow 28, the leaving airflow 18, the ambient airflow 24, and/or an average airflow temperature determined from one or more of these airflow temperatures) and a temperature of the cooling fluid supply 32. In some embodiments, such a control (e.g., approach control) may provide for the adjustment of an amount (e.g., GPM) of cooling fluid supply 32 flowing through the cooling coils 22 to maintain a specific approach temperature. In some embodiments, this approach control may include, for example, serving a cooling fluid control valve (e.g., with an individual or main controller) to stabilize the approach temperature to a desired value. For example, since the amount of cooling fluid supply 32 required to remove a particular amount of heat (e.g., kW) generated by electronic devices in the racks 15 is inversely related to the approach temperature, varying the approach temperature may provide a "knob" to adjust the required GPM/kW to remove the generated heat by flowing the cooling fluid supply 32 through the cooling coils 22.

In some embodiments, at any given snapshot in time, some racks 15 in the data center may be working harder (e.g., generating more kW) than other racks 15. So the required cooling power necessary at any particular location in the data center may vary over time. Approach control may, therefore, provide for the allocation of cooling fluid supply 32 automatically to "follow" the cooling load even though there may be no direct measurement of either power (e.g., kW) or flow rate (e.g., GPM) but rather, temperature measurements.

In some embodiments, the approach control may be substantially static (e.g., approach temperature set point may not vary over time). For example, a static approach control may apply a single, fixed value for the approach temperature set point to all (or most) cooling units 16 in the data center. This may enable the allocation of cooling fluid (e.g., from a central plant or other cooling facility) to follow the cooling load based solely on information available locally at each cooling unit 16 (e.g., leaving air temperature and entering cooling fluid temperature). This mode may allow the temperature on the data center floor to, for example, follow the seasons in accordance with weather impact on cooling plant capacity (e.g., by maximizing free cooling opportunities).

In some embodiments, the approach control may be dynamic (e.g., approach temperature set point for one or more cooling units 16 may vary over time). For example, a dynamic approach control may allow for variance of a desired approach control set point spatially and temporally. The result may be that all (or most) of the available capacity of cooling fluid from a central cooling plant (e.g., a chiller plant, free cooling facility, and/or both) can be more optimally deployed. By dynamically varying the approach temperature set point in response to such factors as, for example, the types of electronic devices (e.g., servers, processors, memory components, etc.) deployed at various locations on the data center floor; the types of services executed by such devices (e.g., web searching, electronic mail, and other web based services); an actual aggregate heat load on the data center floor; an actual cooling system capacity under current weather conditions, data center air temperatures (e.g., for airflows 18, 24, 26, and/or 28) can be moderated. Further, by dynamically varying the approach temperature, oversubscription (e.g., design of a cooling system with more cooling fluid available than used) of the cooling fluid supply 32 may be diminished.

In some embodiments, implementation of a dynamic approach control scheme may utilize information that is not local to the particular cooling units 16. For example, in some embodiments of dynamic approach control, information such as, for example, server deployments, aggregate server power draw, aggregate cooling plant capacities, weather values, and weather predictions in order to select and update an optimum approach set point for each individual cooling unit 16, a group of particular cooling units 16, and/or all of the cooling units 16. Further, while each cooling unit 16 can implement the static approach control locally (e.g., at the individual cooling unit 16), dynamic approach control may be implemented as a cloud based service.

Figure 1B:
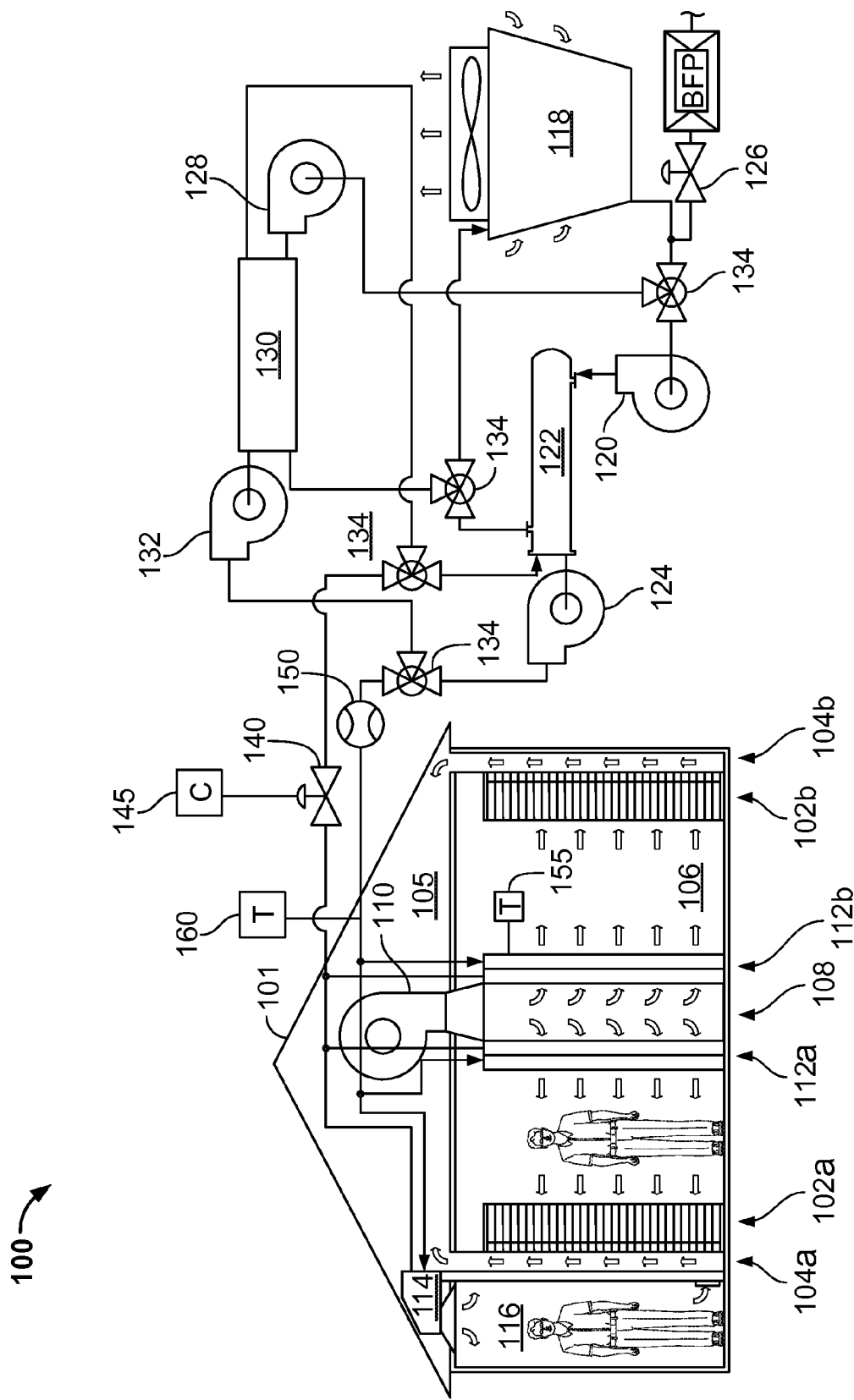
FIG. 1B illustrates a schematic diagram showing a system for cooling a computer data center.

FIG. 1B illustrates a schematic diagram showing a system 100 for cooling a computer data center 101, which as shown, is a building that houses a large number of computers or similar heat-generating electronic components. In some embodiments, the system 100 may implement static approach control and/or dynamic approach control to, for example, control an amount of cooling fluid circulated to cooling modules (such as cooling coils 112a and 112b). A workspace 106 is defined around the computers, which are arranged in a number of parallel rows and mounted in vertical racks, such as racks 102a, 102b. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 106 across the trays and into warm-air plenums 104a, 104b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 106 is known, controlling the exhaust temperature also indirectly controls the temperature rise. The work space 106 may, in certain circumstances, be referenced as a "cold aisle," and the plenums 104a, 104b as "warm aisles."

The temperature rise can be large. For example, the work space 106 temperature may be about 77° F. (25° C.) and the exhaust temperature into the warm-air plenums 104a, 104b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 105, or into a raised floor or basement, or other appropriate space, and may be gathered there by air handling units that include, for example, fan 110, which may include, for example, one or more centrifugal fans appropriately sized for the task. The fan 110 may then deliver the air back into a plenum 108 located adjacent to the workspace 106. The plenum 108 may be simply a bay-sized area in the middle of a row of racks, that has been left empty of racks, and that has been isolated from any warm-air plenums on either side of it, and from cold-air work space 106 on its other sides. Alternatively, air may be cooled by coils defining a border of warm-air plenums 104a, 104b and expelled directly into workspace 106, such as at the tops of warm-air plenums 104a, 104b.

Cooling coils 112a, 112b may be located on opposed sides of the plenum approximately flush with the fronts of the racks. (The racks in the same row as the plenum 108, coming in and out of the page in the figure, are not shown.) The coils may have a large surface area and be very thin so as to present a low pressure drop to the system 100. In this way, slower, smaller, and quieter fans may be used to drive air through the system. Protective structures such as louvers or wire mesh may be placed in front of the coils 112a, 112b to prevent them from being damaged.

In operation, fan 110 pushes air down into plenum 108, causing increased pressure in plenum 108 to push air out through cooling coils 112a, 112b. As the air passes through the coils 112a, 112b, its heat is transferred into the water in the coils 112a, 112b, and the air is cooled.

The speed of the fan 110 and/or the flow rate or temperature of cooling water flowing in the cooling coils 112a, 112b may be controlled in response to measured values. For example, the pumps driving the cooling liquid may be variable speed pumps that are controlled to maintain a particular temperature in work space 106. Such control mechanisms may be used to maintain a constant temperature in workspace 106 or plenums 104a, 104b and attic 105.

The workspace 106 air may then be drawn into racks 102a, 102b such as by fans mounted on the many trays that are mounted in racks 102a, 102b. This air may be heated as it passes over the trays and through power supplies running the computers on the trays, and may then enter the warm-air plenums 104a, 104b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 110 captures and circulates the warm air.

Additional items may also be cooled using system 100. For example, room 116 is provided with a self-contained fan coil unit 114 which contains a fan and a cooling coil. The unit 114 may operate, for example, in response to a thermostat provided in room 116. Room 116 may be, for example, an office or other workspace ancillary to the main portions of the data center 101.

In addition, supplemental cooling may also be provided to room 116 if necessary. For example, a standard roof-top or similar air-conditioning unit (not shown) may be installed to provide particular cooling needs on a spot basis. As one example, system 100 may be designed to deliver 78° F. (25.56° C.) supply air to work space 106, and workers may prefer to have an office in room 116 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 100.

Fresh air may be provided to the workspace 106 by various mechanisms. For example, a supplemental air-conditioning unit (not shown), such as a standard roof-top unit may be provided to supply necessary exchanges of outside air. Also, such a unit may serve to dehumidify the workspace 106 for the limited latent loads in the system 100, such as human perspiration. Alternatively, louvers may be provided from the outside environment to the system 100, such as powered louvers to connect to the warm air plenum 104b. System 100 may be controlled to draw air through the plenums when environmental (outside) ambient humidity and temperature are sufficiently low to permit cooling with outside air. Such louvers may also be ducted to fan 110, and warm air in plenums 104a, 104b may simply be exhausted to atmosphere, so that the outside air does not mix with, and get diluted by, the warm air from the computers. Appropriate filtration may also be provided in the system, particularly where outside air is used.

Also, the workspace 106 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 124. The cooling water circuit may be formed as a direct-return, or indirect-return, circuit, and may generally be a closed-loop system. Pump 124 may take any appropriate form, such as a standard centrifugal pump. Heat exchanger 122 may remove heat from the cooling water in the circuit. Heat exchanger 122 may take any appropriate form, such as a plate-and-frame heat exchanger or a shell-and-tube heat exchanger.

Heat may be passed from the cooling water circuit to a condenser water circuit that includes heat exchanger 122, pump 120, and cooling tower 118. Pump 120 may also take any appropriate form, such as a centrifugal pump. Cooling tower 118 may be, for example, one or more forced draft towers or induced draft towers. The cooling tower 118 may be considered a free cooling source, because it requires power only for movement of the water in the system and in some implementations the powering of a fan to cause evaporation; it does not require operation of a compressor in a chiller or similar structure.

The cooling tower 118 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect waterside economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 122, and routing cooling tower water (condenser water) directly to cooling coils 112a, 112b (not shown). Such an implementation may be more efficient, as it removes one heat exchanging step. However, such an implementation also causes water from the cooling tower 118 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 126 is provided in the condenser water circuit to supply make-up water to the circuit. Make-up water may generally be needed because cooling tower 118 operates by evaporating large amounts of water from the circuit. The control valve 126 may be tied to a water level sensor in cooling tower 118, or to a basin shared by multiple cooling towers. When the water falls below a predetermined level, control valve 126 may be caused to open and supply additional makeup water to the circuit. A back-flow preventer (BFP) may also be provided in the make-up water line to prevent flow of water back from cooling tower 118 to a main water system, which may cause contamination of such a water system.

Optionally, a separate chiller circuit may be provided. Operation of system 100 may switch partially or entirely to this circuit during times of extreme atmospheric ambient (i.e., hot and humid) conditions or times of high heat load in the data center 101. Controlled mixing valves 134 are provided for electronically switching to the chiller circuit, or for blending cooling from the chiller circuit with cooling from the condenser circuit. Pump 128 may supply tower water to chiller 130, and pump 132 may supply chilled water, or cooling water, from chiller 130 to the remainder of system 100. Chiller 130 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 122, with common return water from a cooling coil to both structures. The chilled water may be supplied from chiller 130 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 100.

Pumps 120, 124, 128, 132, may be provided with variable speed drives. Such drives may be electronically controlled by a central control system to change the amount of water pumped by each pump in response to changing set points or changing conditions in the system 100. For example, pump 124 may be controlled to maintain a particular temperature in workspace 106, such as in response to signals from a thermostat or other sensor in workspace 106.

In operation, system 100 may respond to signals from various sensors placed in the system 100. The sensors may include, for example, thermostats, humidistats, flowmeters, and other similar sensors. In one implementation, one or more thermostats may be provided in warm air plenums 104a, 104b, and one or more thermostats may be placed in workspace 106. In addition, air pressure sensors may be located in workspace 106, and in warm air plenums 104a, 104b. The thermostats may be used to control the speed of associated pumps, so that if temperature begins to rise, the pumps turn faster to provide additional cooling waters. Thermostats may also be used to control the speed of various items such as fan 110 to maintain a set pressure differential between two spaces, such as attic 105 and workspace 106, and to thereby maintain a consistent airflow rate. Where mechanisms for increasing cooling, such as speeding the operation of pumps, are no longer capable of keeping up with increasing loads, a control system may activate chiller 130 and associated pumps 128, 132, and may modulate control valves 134 accordingly to provide additional cooling.

Various values for temperature of the fluids in system 100 may be used in the operation of system 100. In one exemplary implementation, the temperature set point in warm air plenums 104a, 104b may be selected to be at or near a maximum exit temperature for trays in racks 102a, 102b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 100.

Using these parameters and the parameters discussed above for entering and exiting air, relatively narrow approach temperatures may be achieved with the system 100. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

In certain implementations, the entering water temperature may be 64° F. (18° C.) and the exiting air temperature 77° F. (25° C.), as noted above, for an approach temperature of 12.6° F. (7° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

As illustrated, the system 100 also includes a control valve 140 and a controller 145 operable to modulate the valve 140 in response to or to maintain, for example, an approach temperature set point of the cooling coils 112a and 112b. For example, an airflow temperature sensor 155 may be positioned at a leaving face of one or both of the cooling coils 112a and 112b. The temperature sensor 155 may thus measure a leaving air temperature from the cooling coils 112a and/or 112b. A temperature sensor 160 may also be positioned in a fluid conduit that circulates the cooling water to the cooling coils 112a and 112b (as well as fan coil 114).

Controller 145, as illustrated, may receive temperature information from one or both of the temperature sensors 155 and 160. In some embodiments, the controller 145 may be a main controller (i.e., processor-based electronic device or other electronic controller) of the cooling system of the data center, which is communicably coupled to each control valve (such as control valve 140) of the data center and/or individual controllers associated with the control valves. For example, the main controller may be a master controller communicably coupled to slave controllers at the respective control valves. In some embodiments, the controller 145 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations. In some example embodiments, the controller 145 (or other controllers described herein) may be a programmable logic controller (PLC), a computing device (e.g., desktop, laptop, tablet, mobile computing device, server or otherwise), or other form of controller. In cases in which a controller may control a fan motor, for instance, the controller may be a circuit breaker or fused disconnect (e.g., for on/off control), a two-speed fan controller or rheostat, or a variable frequency drive.

In operation, the controller 145 may receive the temperature information and determine an actual approach temperature. The controller 145 may then compare the actual approach temperature set point against a predetermined approach temperature set point. Based on a variance between the actual approach temperature and the approach temperature set point, the controller 145 may modulate the control valve 140 (and/or other control valves fluidly coupled to cooling modules such as the cooling coils 112a and 112b and fan coil 114) to restrict or allow cooling water flow. For instance, in the illustrated embodiment, modulation of the control valve 140 may restrict or allow flow of the cooling water from or to the cooling coils 112a and 112b as well as the fan coil 114. After modulation, if required, the controller 145 may receive additional temperature information and further modulate the control valve 140 (e.g., implement a feedback loop control).

Figure 2A:
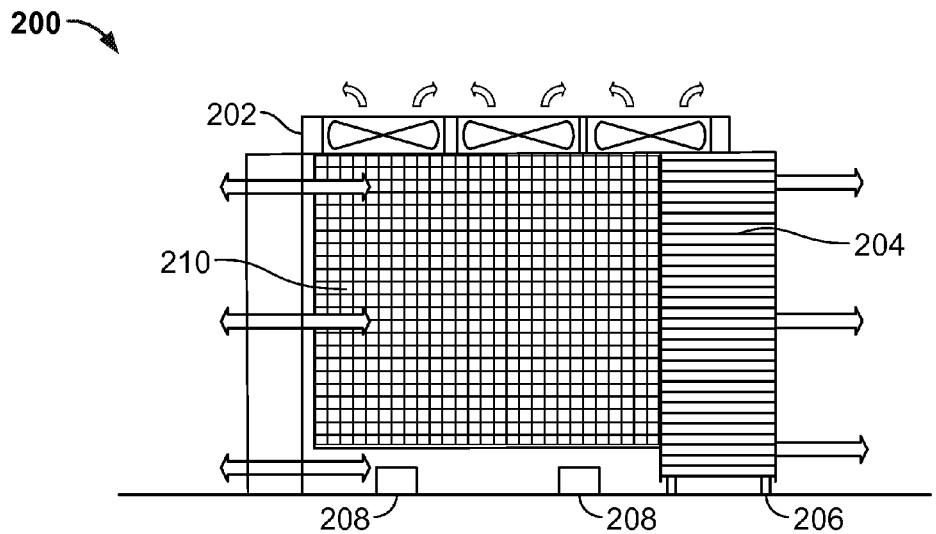
FIGS. 2A-2B show views of an example data center cooling apparatus with a single computer rack and a pair of back-to-back computer racks, respectively.
Figure 2B:
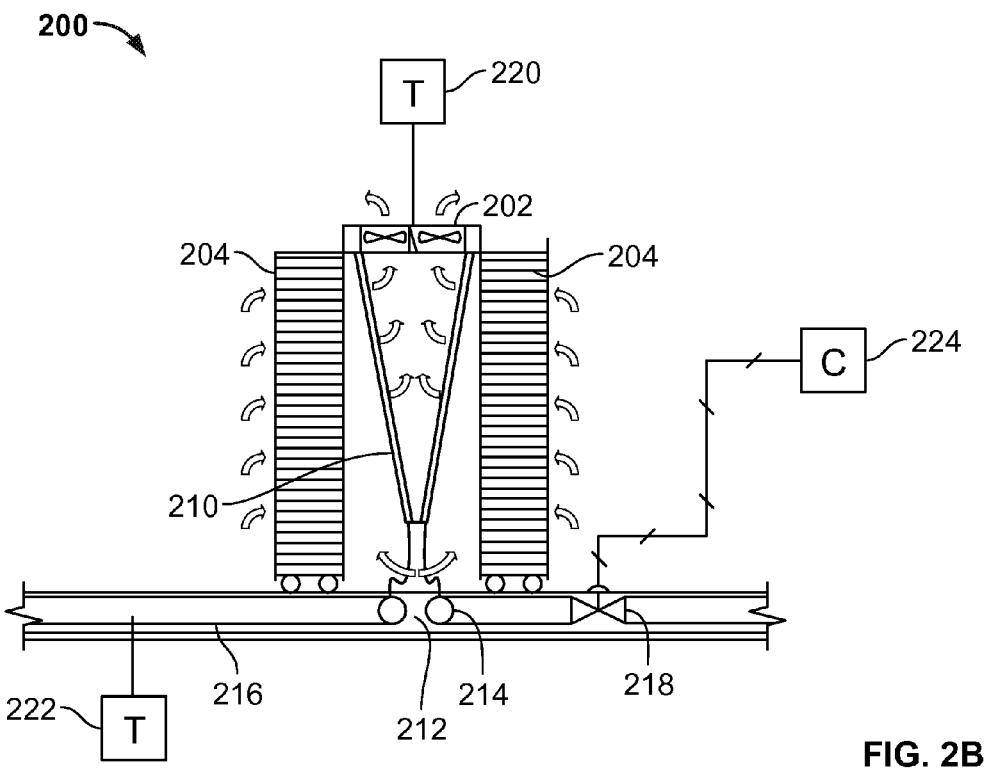

FIGS. 2A-2B show views of an example data center cooling apparatus with a single computer rack 204 and a pair of back-to-back computer racks 204, respectively. Turning to FIG. 2A, in general, this figure shows a computer rack 204 positioned in front of a modular cooling apparatus 202, to form an air circulation system 200. In this example, the rack 204 is a single bay rather than a three-bay assembly as in the earlier figures. The other two bays have been left out to provide a clearer view of the apparatus 202 relative to the rack 204. FIG. 2A shows a side view of the same apparatus, with another computer rack on a back side of the apparatus 202, to form a back-to-back configuration.

The rack 204 is provided with caster wheels 206 (or another type of roller) so that it may be easily manipulated by a technician in a data center, and positioned in front of the apparatus 202. Locking structures or other joining mechanisms may hold the rack 204 in place and may, in appropriate circumstances, seal the rack to the apparatus 202 to prevent air leaks. However, where fans in the apparatus 202 are controlled to maintain a nearly zero pressure differential between the workspace and the area at the front of the apparatus 202, there is less need for such sealing because of the lack of a pressure differential between a warm air capture plenum in the apparatus 202 and the workspace.

The face of apparatus 202, near its left side, is visible in FIG. 2A because no racks have yet been positioned there. This view shows a front surface of a coil 310, which may be a surface like one sees when looking at the front of a car radiator. In this example, the surface area may be relatively large, such as on the order of 6 feet wide by 5 feet high. The coils may be sized in an appropriate manner to provide cooling to offset the heat generated by computers in a rack 204 and in other racks corresponding to apparatus 202. Also, a space may be provided beneath the coils to prevent air to pass from one side of the apparatus 202 to the other. As shown by the flow arrows, air may also be allowed to pass in and out of ends of the apparatus 202.

Figure 4:
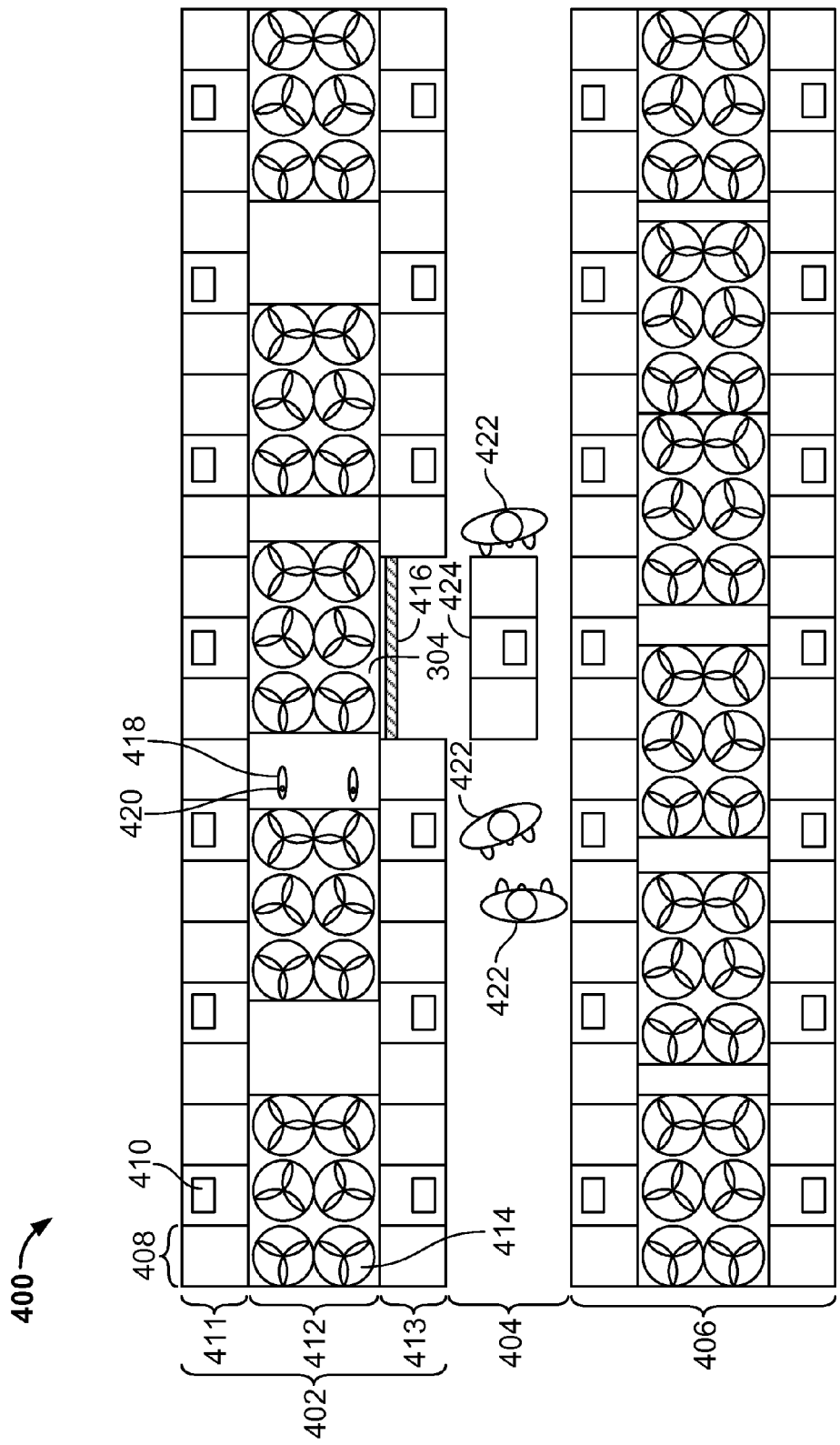
FIG. 4 shows a plan view of two rows in a computer data center with cooling modules arranged between racks situated in the rows.

In one example, apparatus 202 may support six or more bays in a pair of racks, as may be seen in FIG. 4 and the accompanying description. Each bay may, in turn, host on the order of 20 to 40 trays, which may each include one or more microprocessors and associated electronics, and a power supply. Certain of the trays may be dedicated to processing, while other trays may be dedicated wholly or in part to storage or networking, and may host a number of hard drives or other storage mechanisms, which generally generate less heat than do microprocessors.

FIG. 2A also shows lifting structures in the form of skid channels 208 under the apparatus 202. As explained above, such structures may provide for convenient transport, movement, positioning, and repositioning of the apparatus 202 by standard processes and with standard equipment. Other lifting structures such as overhead hooks may also be employed. The ends of apparatus 202 are also shown as being open, as described above and as indicated by air flow arrows pointing left and right in FIG. 2A along the length of apparatus 202, to permit for apparatus-to-apparatus flow of warm air.

As shown in FIG. 2B, a back-to-back arrangement is provided, and a V-shaped coil 210 arrangement is also provided. From this angle, a raised floor is shown as defining a sub-space 212 below the data center. The sub-space 212 may hold, for example, coolant (e.g., water or refrigerant) supply piping 216 and return piping 214. Connections tapping off of such piping may extend up through the floor and into the apparatus 202.

In another arrangement, the raised floor may be eliminated, and the piping 216 and 214 may run lengthwise inside the apparatus 202. Such piping may be moved into place after a row or part of a row of such apparatuses are moved into place (e.g., by sliding it down the row and into the housings). Alternatively, each apparatus may have its own length of supply piping and a length of return piping that each terminate near an end of the apparatus housing. Piping segments for adjacent apparatuses may then be connected using short flexible connectors. Or where such apparatuses are separated by a space, the connection may be made by a length of standard piping inserted between the adjacent apparatuses (perhaps with flexible connections at each end).

The illustrated air circulation system 200 also includes a temperature sensor 220 positioned to measure a leaving air temperature of the cooling apparatus 202 (e.g., from the fans of the apparatus 202). Another temperature sensor 222 is positioned in the supply piping 216 to measure a temperature of a cooling fluid circulated to cooling coils 210. Alternatively, the temperature sensor 222 may be positioned elsewhere in the system 200 to measure the temperature of the cooling fluid circulated to the cooling coils 210.

The illustrated circulation system 200 also includes a control valve 218 positioned to restrict flow of the cooling fluid through the cooling coils 210. As illustrated, the control valve 218 is positioned in line with the return piping 214. Alternatively, the control valve 218 may be positioned in the supply piping 216 or at another location in fluid communication with the cooling coils 210.

The illustrated circulation system 200 also includes a controller 224 in communication with the control valve 218. In some embodiments, the controller 224 may modulate the control valve 218 according to an approach temperature set point (e.g., a predetermined value defined by a difference between a leaving air temperature of the cooling apparatus 202 and an entering fluid temperature to the cooling coils 210). In some embodiments, as described above, the controller 224 may adjust the approach temperature set point according to a variety of factors. Further, in some embodiments, the controller 224 may be an individual (e.g., slave) controller that receives commands (e.g., approach temperature set point) from a master or main controller of the air circulation system 200 and/or data center.

Figure 3A:
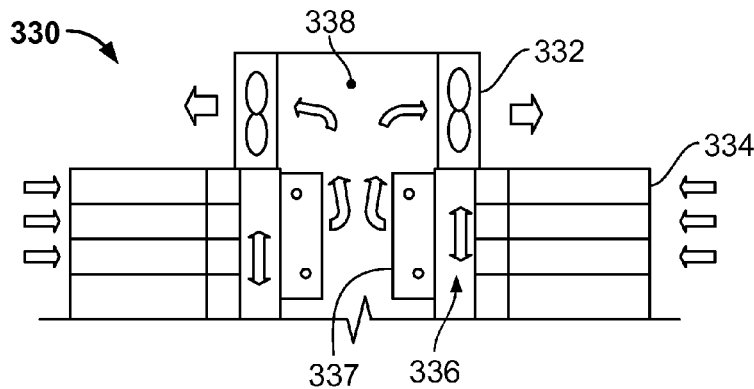
FIGS. 3A-3C illustrate example embodiments of a portion of a data center cooling apparatus positioned adjacent a pair of racks.
Figure 3B:
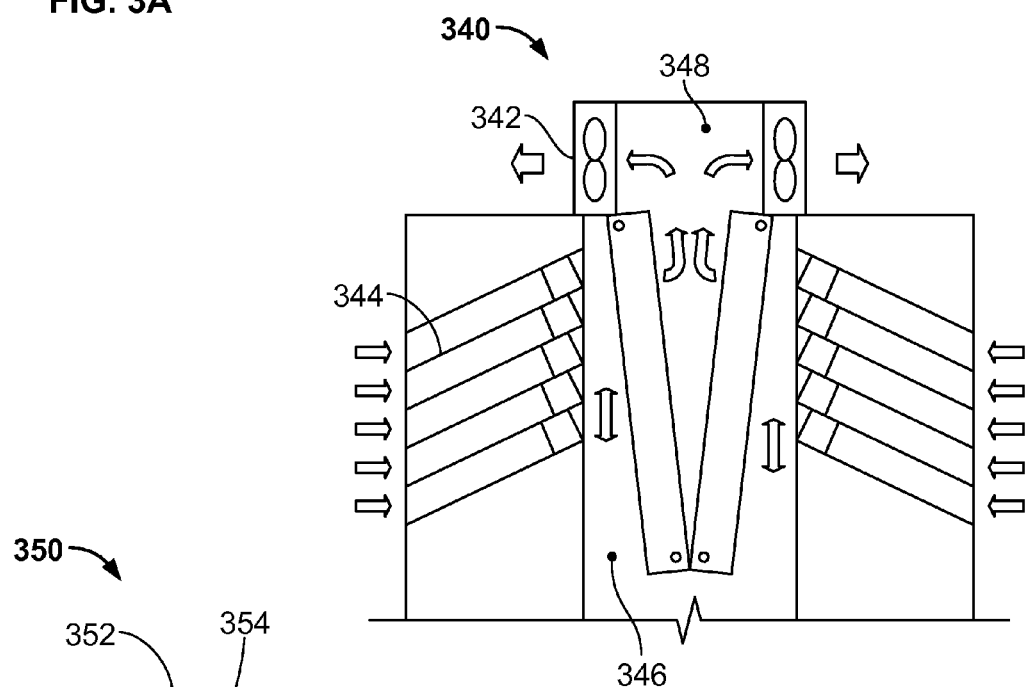
Figure 3C:
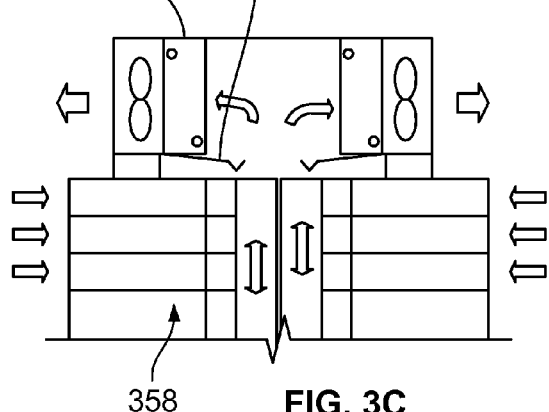

FIGS. 3A-3C illustrate example embodiments of a portion of a data center cooling apparatus positioned adjacent a pair of racks. For example, FIG. 3A shows a side view 330 of a pair of racks having stand-offs at their back edges. In general, this figure shows that the racks may extend farther backward than do the motherboards and other associated items in the rack that block air from flowing up and down. In this manner, a space may be maintained or provided for behind the exhaust point for each tray, so that air may move relatively freely from area to area behind the trays, even if the racks are pushed flat up against a coil having a vertical face that effectively seals against the back surface of the rack. As a result, hot exiting air may spread out some before passing through the coil so that more of the surface area of the coil is used for cooling. Also, air may move up and down or side-to-side to provide better diversity in a system, in case certain areas are presenting a higher heat load than are others, or certain areas have less capacity (such as if coils in those areas are defective or broken) than do others. Also, by permitting spreading of the air, the coil 337 may use much more of its cooling surface area, and not just the area that is directly targeted by fans.

As shown in the example from the figure, a rack 334 holding a number of removable trays is positioned back-to-back with another rack. Vertical coil 337 is positioned against the back edge of the rack 334. Because the rack 334 is deeper than are the trays inserted into the rack, a space 336 is defined up and down the rack 334 behind the trays. For example, the back edge of the trays may hold a number of circulation fans and/or power supplies through which warmed air is ejected from the trays. Air is drawn by fan 332 through coil 337 into cool air plenum 338. In this example, the coil 337 is shown as a vertical coil covering part of the back of the rack, and pressed flat against the back of the rack; other arrangements for the coil may also be used, however. For example, the coil may be placed above the top levels of the racks and the racks may be pressed back-to-back against each other, with lateral and up-and-down airflow entirely in the stand-off areas. In one example, the coils may be arranged as an inverted V, immediately over the warm air plenum that is formed between the opposed back edges of the trays in the racks.

The separation, or stand-off, may be implemented in a variety of manners. For example, the frame of the rack may be arranged to be deeper than are the various trays placed in the rack; the sides of the frames may also be left open so as to permit lateral air flow even when frames are pressed back-to-back against each other. Likewise, the frame may have substantially the same depth as the trays, and extensions may be affixed to the rack and stick out backward from the rack to act as a standoff. Other mechanisms for ensuring some spacing or a particular extent of spacing, may also be used.

FIG. 3B shows a side view 340 of a pair of racks having slanted trays. One example is tray 344, which is arranged as part of an array of trays in a vertical stack, similar to the other examples discussed above. Also, the tray 344 has a power supply and circulation fan at its back edge. In this example, however, the tray 344, like the other trays, is substantially higher at its back end than at its front end. In operation, circulating air is thus drawn in the front of the rack holding tray 344 and other trays, and into warm air plenum 346 behind the trays. The air is then drawn through cooling coils by fan 342 and into cool air plenum 348, where it is then circulated back into the workspace. The area at the front of a rack above the highest tray may be covered by a blanking panel or other structure to prevent air flow at such a location.

The fans and/or power supply associated with tray 344 may be mounted with the tray 344 or separately. Thus, for example, the axis of the fan may be co-axial with the direction of airflow up the tray 344 (i.e., the fan may be slanted with the tray 344), or the fan may be positioned horizontally, vertically, or in another orientation that differs from the angle of the tray 344.

Because the air is warmed by electronic components on the tray 344 as it passes over the tray 344, it tends to rise naturally from the front of the tray 344 toward the back. Such natural motion may create or supplement the air circulation across the tray 344. In certain implementations, mechanical circulating systems such as fans may be removed from the back edges of the trays so that the back edges are partially or wholly open, and the natural convection of the warmed air may push the air out the back of the trays even in the absence of substantial mechanical assistance. Such natural circulation may increase air circulation during normal operation and may also permit certain circulation so as to permit limited operation even when mechanical systems fails, or to act as sufficient total circulation for trays carrying components having a low heat load. Also, although mounting of the racks at a substantial angle, such as more than 20 degrees, more than 30 degrees, or more than 40 degrees from the horizontal, can create potentially wasteful dead space (see the open triangular area above rack 344), such space is not wasted in this context because the top trays can take up space above a worker's reach because the worker need only reach the front, lowest part of the top tray for maintenance purposes.

FIG. 3C shows a side view 350 of a pair of racks of computers having coils mounted above the racks. In general, this implementation differs from others described in this document in that the cooling coil here is mounted above the racks rather than below or behind them. Placement of cooling coils above a rack may typically be discouraged because such an arrangement places water-filled components above electrical devices that could short out if hit by water. However, in this implementation, shields 354 are provided below the coils 352 to catch any leaking water and to channel it away from the computers 358, such as laterally (as viewing the racks from their front, open edges) and then against an end wall of a row of racks, to a downpipe, or to another fluid collection mechanism.

The shields 354 may be sloped slightly from the horizontal from front to back to direct fluid back so that it is no longer over any trays, and from side-to-side to direct fluid to one of their sides, such as a side that is not over the computers 358, and may also be provided with a deepened channel that can carry additional fluid without flowing over an edge of the shields 354. For example, where the shields are made from sheet metal or a similar material, gutters may be formed along an edge by crimping the metal along a line.

The shields 354 may be arranged and configured in a variety of manners so as to lessen the chance that water may splash or otherwise reach the computers 358. For example, multiple angles may be crimped into the shield 354 so as to lessen upward splashing when water hits the shield 354. Also, the top surface of the shield may be perforated, or a screen, foam pad, or similar structure may be laid over the shield 354 to lessen any splashing. Also, other portions of the racks may be likewise configured to prevent dripping or splashing. For example, frame members of a rack may have their edges curled or crimped backward so as to catch water that would otherwise drip off the edges and perhaps onto a motherboard. Such frame members may then have drain holes provided at appropriate locations along their lengths so as to permit caught water to drain downward.

Placement of coils over the level of racks may provide a number of benefits. For example, by moving coils out of the space between racks, the racks may generally be moved closer together because the space for vertical airflow in the warm air plenum is substantially unimpeded. For example, the racks of FIG. 3C are shown as touching back-to-back (with a stand-off between the back of each motherboard and the back of each rack, to permit for up and down airflow), while the racks in the other figures show a greater spacing. The particular reduction in spacing will, of course, depend on the particular levels of airflow needed to cool the system. As a result, additional floor space may be recovered in a facility with a coil-on-top arrangement.

In addition, placing coils above rather than below the rack may allow additional computers to be installed up and down a rack and still be within acceptable reach of a technician. For instance, if a cooling module is two feet off the ground (that is, the coil portion of the cooling module, as shown in FIG. 1B), and computers are only installed in line with the coil portion, removing the module from the bottom of a rack may enable a system to have two additional feet of computers in every rack, and to thus use several additional computers in every rack. Generally, coils do not fail as often as computers do, so having coils in an out-of-reach area is less troublesome than having computers in such an area. Moreover, the coils in this arrangement may be mounted to long-term infrastructure, such as scaffolding that sits behind or between particular racks. As a result, the racks may be readily moved into position.

In a similar arrangement a wall may be supplied at a back wall of the warm-air plenum for each opposed rack, and/or the coil and fan arrangement may be integrated to move with the rack. In such an arrangement, the computer rack and the cooling and ventilation system would be part of a single assembly. The back panel may be used to create a single warm air plenum for a rack or adjacent racks (with airflow permitted laterally between adjacent racks) in a single row (e.g., for use when a row of racks backs up to a wall) or the back panel may be omitted to create a common warm air plenum for back-to-back rows of racks.

Also, the coil may be placed on the top of the rack or the bottom of the rack in such an integrated implementation. When placed on top, the coil may be positioned horizontally, with air flowing through it vertically, and the fans may be placed on top of the coil blowing up. When placed on the bottom, a right angle plenum may be used to route air under the rack and through a vertically mounted coil (having horizontal airflow) and fan.

FIG. 4 shows a plan view of two rows 402 and 406, respectively, in a computer data center 400 with cooling modules arranged between racks situated in the rows. In some embodiments, the data center 400 may implement static approach control and/or dynamic approach control to, for example, control an amount of cooling fluid circulated to cooling modules. In general, this figure illustrates certain levels of density and flexibility that may be achieved with structures like those discussed above. Each of the rows 402, 406 is made up of a row of cooling modules 412 sandwiched by two rows of computing racks 411, 413. In some implementations (not shown), a row may also be provided with a single row of computer racks, such as by pushing the cooling modules up against a wall of a data center, providing blanking panels all across one side of a cooling module row, or by providing cooling modules that only have openings on one side.

This figure also shows a component—network device 410—that was not shown in prior figures. Network device 410 may be, for example, a network switch into which each of the trays in a rack plugs, and which then in turn communicates with a central network system. For example, the network device may have 20 or data more ports operating at 100 Mbps or 1000 Mbps, and may have an uplink port operating at 1000 Mbps or 10 Gbps, or another appropriate network speed. The network device 410 may be mounted, for example, on top of the rack, and may slide into place under the outwardly extending portions of a fan tray. Other ancillary equipment for supporting the computer racks may also be provided in the same or a similar location, or may be provided on one of the trays in the rack itself.

Each of the rows of computer racks and rows of cooling units in each of rows 402, 406 may have a certain unit density. In particular, a certain number of such computing or cooling units may repeat over a certain length of a row such as over 100 feet. Or, expressed in another way, each of the units may repeat once every X feet in a row.

In this example, each of the rows is approximately 40 feet long. Each of the three-bay racks is approximately six feet long. And each of the cooling units is slightly longer than each of the racks. Thus, for example, if each rack were exactly six feet long and all of the racks were adjoining, the rack units would repeat every six feet. As a result, the racks could be said to have a six-foot "pitch."

As can be seen, the pitch for the cooling module rows is different in row 402 than in row 406. Row 412 in row 402 contains five cooling modules, while the corresponding row of cooling modules in row 406 contains six cooling modules. Thus, if one assumes that the total length of each row is 42 feet, then the pitch of cooling modules in row 406 would be 7 feet (42/6) and the pitch of cooling modules in row 402 would be 8.4 feet (42/5).

The pitch of the cooling modules and of the computer racks may differ (and the respective lengths of the two kinds of apparatuses may differ) because warm air is able to flow up and down rows such as row 412. Thus, for example, a bay or rack may exhaust warm air in an area in which there is no cooling module to receive it. But that warm air may be drawn laterally down the row and into an adjacent module, where it is cooled and circulated back into the work space, such as aisle 404.

With all other things being equal, row 402 would receive less cooling than would row 406. However, it is possible that row 402 needs less cooling, so that the particular number of cooling modules in each row has been calculated to match the expected cooling requirements. For example, row 402 may be outfitted with trays holding new, low-power microprocessors; row 402 may contain more storage trays (which are generally lower power than processor trays) and fewer processor trays; or row 402 may generally be assigned less computationally intensive work than is row 406.

In addition, the two rows 402, 406 may both have had an equal number of cooling modules at one time, but then an operator of the data center may have determined that row 402 did not need as many modules to operate effectively. As a result, the operator may have removed one of the modules so that it could be used elsewhere.

The particular density of cooling modules that is required may be computed by first computing the heat output of computer racks on both sides of an entire row. The amount of cooling provided by one cooling module may be known, and may be divided into the total computed heat load and rounded up to get the number of required cooling units. Those units may then be spaced along a row so as to be as equally spaced as practical, or to match the location of the heat load as closely as practical, such as where certain computer racks in the row generate more heat than do others. Also, as explained in more detail below, the row of cooling units may be aligned with rows of support columns in a facility, and the units may be spaced along the row so as to avoid hitting any columns.

Where there is space between cooling modules, a blanking panel 420 may be used to block the space so that air from the warm air capture plenum does not escape upward into the work space. The panel 420 may simply take the form of a paired set of sheet metal sheets that slide relative to each other along slots 418 in one of the sheets, and can be fixed in location by tightening a connector onto the slots.

FIG. 4 also shows a rack 424 being removed for maintenance or replacement. The rack 424 may be mounted on caster wheels so that one of technicians 422 could pull it forward into aisle 404 and then roll it away. In the figure, a blanking panel 416 has been placed over an opening left by the removal of rack 424 to prevent air from the work space from being pulled into the warm air capture plenum, or to prevent warm air from the plenum from mixing into the work space. The blanking panel 416 may be a solid panel, a flexible sheet, or may take any other appropriate form.

In one implementation, a space may be laid out with cooling units mounted side-to-side for maximum density, but half of the units may be omitted upon installation (e.g., so that there is 50% coverage). Such an arrangement may adequately match the cooling unit capacity (e.g., about four racks per unit, where the racks are approximately the same length as the cooling units and mounted back-to-back on the cooling units) to the heat load of the racks. Where higher powered racks are used, the cooling units may be moved closer to each other to adapt for the higher heat load (e.g., if rack spacing is limited by maximum cable lengths), or the racks may be spaced from each other sufficiently so that the cooling units do not need to be moved. In this way, flexibility may be achieved by altering the rack pitch or by altering the cooling unit pitch.

Figure 5A:
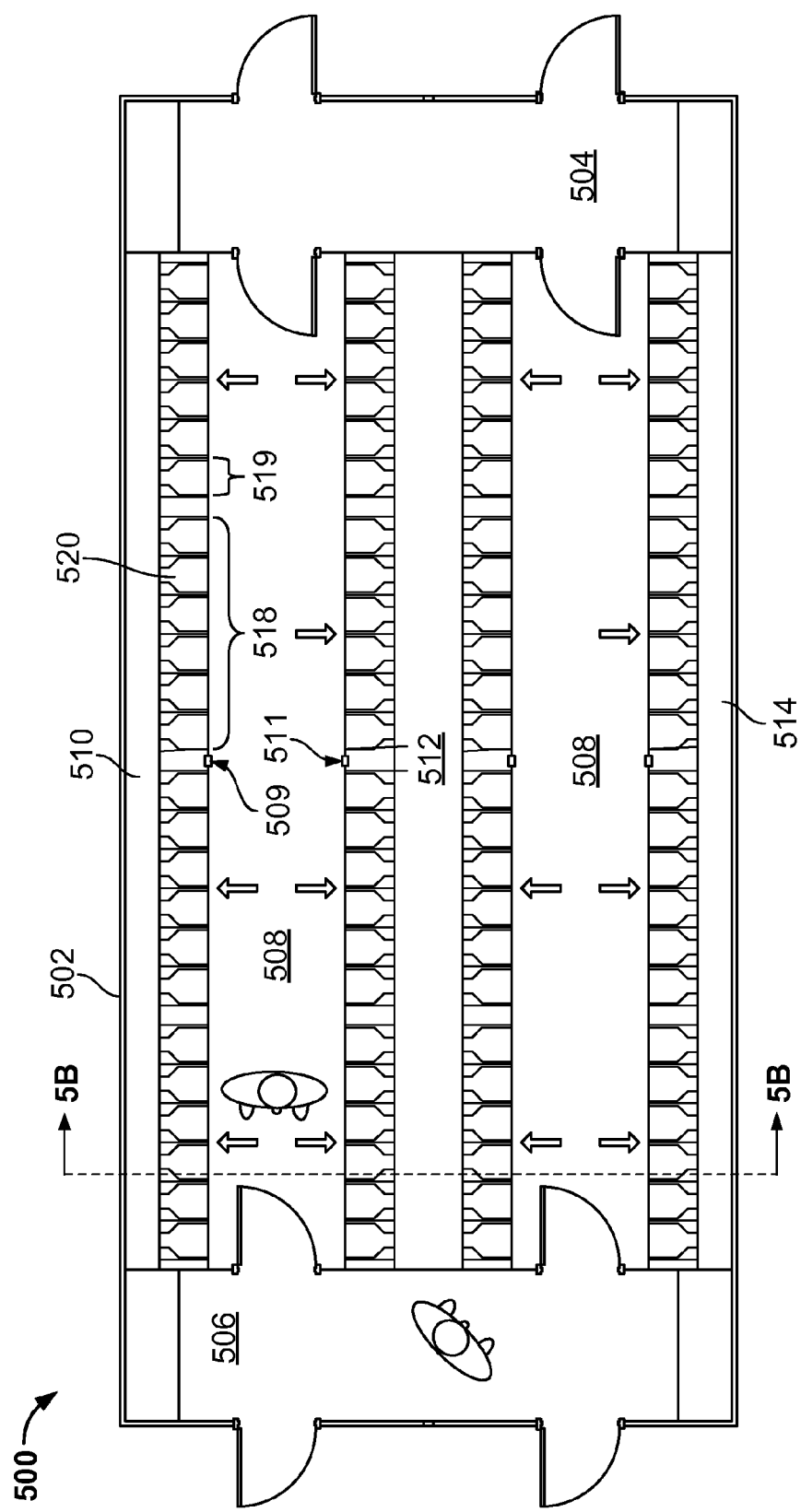

FIGS. 5A-5B show plan and sectional views, respectively, of a modular data center system. In some embodiments, one of more data processing centers 500 may implement static approach control and/or dynamic approach control to, for example, control an amount of cooling fluid circulated to cooling modules. The system may include one of more data processing centers 500 in shipping containers 502. Although not shown to scale in the figure, each shipping container 502 may be approximately 40 feet along, 8 feet wide, and 9.5 feet tall (e.g., a 1 AAA shipping container). In other implementations, the shipping container can have different dimensions (e.g., the shipping container can be a 1CC shipping container). Such containers may be employed as part of a rapid deployment data center.

Each container 502 includes side panels that are designed to be removed. Each container 502 also includes equipment designed to enable the container to be fully connected with an adjacent container. Such connections enable common access to the equipment in multiple attached containers, a common environment, and an enclosed environmental space.

Each container 502 may include vestibules 504, 506 at each end of the relevant container 502. When multiple containers are connected to each other, these vestibules provide access across the containers. One or more patch panels or other networking components to permit for the operation of data processing center 500 may also be located in vestibules 504, 506. In addition, vestibules 504, 506 may contain connections and controls for the shipping container. For example, cooling pipes (e.g., from heat exchangers that provide cooling water that has been cooled by water supplied from a source of cooling such as a cooling tower) may pass through the end walls of a container, and may be provided with shut-off valves in the vestibules 504, 506 to permit for simplified connection of the data center to, for example, cooling water piping. Also, switching equipment may be located in the vestibules 504, 506 to control equipment in the container 502. The vestibules 504, 506 may also include connections and controls for attaching multiple containers 502 together. As one example, the connections may enable a single external cooling water connection, while the internal cooling lines are attached together via connections accessible in vestibules 504, 506. Other utilities may be linkable in the same manner.

Central workspaces 508 may be defined down the middle of shipping containers 502 as aisles in which engineers, technicians, and other workers may move when maintaining and monitoring the data processing center 500. For example, workspaces 508 may provide room in which workers may remove trays from racks and replace them with new trays. In general, each workspace 508 is sized to permit for free movement by workers and to permit manipulation of the various components in data processing center 500, including providing space to slide trays out of their racks comfortably. When multiple containers 502 are joined, the workspaces 508 may generally be accessed from vestibules 504, 506.

A number of racks such as rack 519 may be arrayed on each side of a workspace 508. Each rack may hold several dozen trays, like tray 520, on which are mounted various computer components. The trays may simply be held into position on ledges in each rack, and may be stacked one over the other. Individual trays may be removed from a rack, or an entire rack may be moved into a workspace 508.

The racks may be arranged into a number of bays such as bay 518. In the figure, each bay includes six racks and may be approximately 8 feet wide. The container 502 includes four bays on each side of each workspace 508. Space may be provided between adjacent bays to provide access between the bays, and to provide space for mounting controls or other components associated with each bay. Various other arrangements for racks and bays may also be employed as appropriate.

Warm air plenums 510, 514 are located behind the racks and along the exterior walls of the shipping container 502. A larger joint warm air plenum 512 is formed where the two shipping containers are connected. The warm air plenums receive air that has been pulled over trays, such as tray 520, from workspace 508. The air movement may be created by fans located on the racks, in the floor, or in other locations. For example, if fans are located on the trays and each of the fans on the associated trays is controlled to exhaust air at one temperature, such as 40° C., 42.5° C., 45° C., 47.5° C., 50° C., 52.5° C., 55° C., or 57.5° C., the air in plenums 510, 512, 514 will generally be a single temperature or almost a single temperature. As a result, there may be little need for blending or mixing of air in warm air plenums 510, 512, 514. Alternatively, if fans in the floor are used, there will be a greater degree temperature variation from air flowing over the racks, and greater degree of mingling of air in the plenums 510, 512, 514 to help maintain a consistent temperature profile.

FIG. 5B shows a sectional view of the data center from FIG. 5A. This figure more clearly shows the relationship and airflow between workspaces 508 and warm air plenums 510, 512, 514. In particular, air is drawn across trays, such as tray 520, by fans at the back of the trays 519. Although individual fans associated with single trays or a small number of trays, other arrangements of fans may also be provided. For example, larger fans or blowers, may be provided to serve more than one tray, to serve a rack or group or racks, or may be installed in the floor, in the plenum space, or other location.

Air may be drawn out of warm air plenums 510, 512, 514 by fans 522, 524, 526, 528. Fans 522, 524, 526, 528 may take various forms. In one exemplary embodiment, the may be in the form of a number of squirrel cage fans. The fans may be located along the length of container 502, and below the racks, as shown in FIG. 5B. A number of fans may be associated with each fan motor, so that groups of fans may be swapped out if there is a failure of a motor or fan.

An elevated floor 530 may be provided at or near the bottom of the racks, on which workers in workspaces 508 may stand. The elevated floor 530 may be formed of a perforated material, of a grating, or of mesh material that permits air from fans 522, 524 to flow into workspaces 508. Various forms of industrial flooring and platform materials may be used to produce a suitable floor that has low pressure losses.

Fans 522, 524, 526, 528 may blow heated air from warm air plenums 510, 512, 514 through cooling coils 562, 564, 566, 568. The cooling coils may be sized using well known techniques, and may be standard coils in the form of air-to-water heat exchangers providing a low air pressure drop, such as a 0.5 inch pressure drop. Cooling water may be provided to the cooling coils at a temperature, for example, of 10, 15, or 20 degrees Celsius, and may be returned from cooling coils at a temperature of 20, 25, 30, 35, or 40 degrees Celsius. In other implementations, cooling water may be supplied at 15, 10, or 20 degrees Celsius, and may be returned at temperatures of about 25 degrees Celsius, 30 degrees Celsius, 35 degrees Celsius, 45 degrees Celsius, 50 degrees Celsius, or higher temperatures. The position of the fans 522, 524, 526, 528 and the coils 562, 564, 566, 568 may also be reversed, so as to give easier access to the fans for maintenance and replacement. In such an arrangement, the fans will draw air through the cooling coils.

The particular supply and return temperatures may be selected as a parameter or boundary condition for the system, or may be a variable that depends on other parameters of the system. Likewise, the supply or return temperature may be monitored and used as a control input for the system, or may be left to range freely as a dependent variable of other parameters in the system. For example, the temperature in workspaces 508 may be set, as may the temperature of air entering plenums 510, 512, 514. The flow rate of cooling water and/or the temperature of the cooling water may then vary based on the amount of cooling needed to maintain those set temperatures.

The particular positioning of components in shipping container 502 may be altered to meet particular needs. For example, the location of fans and cooling coils may be changed to provide for fewer changes in the direction of airflow or to grant easier access for maintenance, such as to clean or replace coils or fan motors. Appropriate techniques may also be used to lessen the noise created in workspace 508 by fans. For example, placing coils in front of the fans may help to deaden noise created by the fans. Also, selection of materials and the layout of components may be made to lessen pressure drop so as to permit for quieter operation of fans, including by permitting lower rotational speeds of the fans. The equipment may also be positioned to enable easy access to connect one container to another, and also to disconnect them later. Utilities and other services may also be positioned to enable easy access and connections between containers 502.

Airflow in warm air plenums 510, 512, 514 may be controlled via pressure sensors. For example, the fans may be controlled so that the pressure in warm air plenums is roughly equal to the pressure in workspaces 508. Taps for the pressure sensors may be placed in any appropriate location for approximating a pressure differential across the trays 520. For example, one tap may be placed in a central portion of plenum 512, while another may be placed on the workspace 508 side of a wall separating plenum 512 from workspace 508. For example the sensors may be operated in a conventional manner with a control system to control the operation of fans 522, 524, 526, 528. One sensor may be provided in each plenum, and the fans for a plenum or a portion of a plenum may be ganged on a single control point.

For operations, the system may better isolate problems in one area from other components. For instance, if a particular rack has trays that are outputting very warm air, such action will not affect a pressure sensor in the plenum (even if the fans on the rack are running at high speed) because pressure differences quickly dissipate, and the air will be drawn out of the plenum with other cooler air. The air of varying temperature will ultimately be mixed adequately in the plenum, in a workspace, or in an area between the plenum and the workspace.

FIG. 6 illustrates an example control loop 600 for controlling a data center cooling apparatus 612. In some embodiments, the cooling apparatus 612 may be similar to, for example, the cooling unit 16 shown in FIG. 1, or other cooling apparatus described in the present disclosure. In some embodiments, the control loop 600 may control the cooling apparatus 612 to maintain and/or adjust a flow of cooling fluid to the cooling apparatus 612 to meet an approach temperature set point of the cooling apparatus 612. The approach temperature set point, in some embodiments, may be a difference between a leaving air temperature from the cooling apparatus 612 and an entering cooling fluid temperature to the cooling apparatus 612. In some embodiments, the illustrated cooling apparatus 612 may represent multiple cooling units in the data center, such as, for example, a group of cooling units, several groups of cooling units, or all of the cooling units in the data center.

As illustrated, the control loop 600 includes an input value 602 and a feedback value 614 that are provided to a summing function 604. In some embodiments, the input value 602 may represent a desired valve position (e.g., percentage open value) of a particular valve (or group of valves) associated with a particular cooling apparatus 612 in the data center. For example, the desired valve position may be 100% open. In some embodiments, the desired valve position may be about 95% open, thereby providing for some headroom for control of the valve.

The feedback value 614, in the illustrated embodiment, may represent the valve position (i.e., percent open) of the particular valve associated with the cooling apparatus 612. For example, the particular valve may be "X" percentile valve as determined based on flow rate data in the data center. In some embodiments, the particular valve may be the $2^{nd}$ percentile control valve, meaning that about 98% of the valves associated with cooling apparatus in the data center are at, or are less than, the valve position (i.e., percent open) of the $2^{nd}$ percentile valve.

The summing function 604 compares the input value 602 and the feedback value 614 and provides an output value 606 to a controller 608. Of course, in some embodiments, the summing function 604 is implemented by the controller 608. In some embodiments, the controller 608 may be a main controller of the cooling system of the data center, which is communicably coupled to each control valve of the data center and/or the individual controllers associated with the control valves. For example, the main controller may be a master controller communicably coupled to slave controllers at the respective control valves. In some embodiments, the controller 608 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations.

The controller 608 receives and/or determines the output value 606 (e.g., a difference between the input value 602 and the feedback value 614). Based on the output value 606, the controller 608 may adjust an approach temperature set point 610 communicated to the cooling apparatus 612. For example, if the output value 606 defines a difference between the input value 602 and the feedback value 614 greater than a threshold value (e.g., more than 1° C.), the approach temperature set point 610 may be adjusted by the controller 608.

If the feedback value 614 is less than the input value 602 (i.e., the X percentile valve is less open than desired), then the controller 608 may adjust the approach temperature set point 610 downward (i.e., decreased), thereby causing the control valve or valves to open and circulate more cooling fluid to the cooling apparatus 612. Alternatively, if the feedback value 614 is more than the input value 602 (i.e., the X percentile valve is more open than desired), then the controller 608 may adjust the approach temperature set point 610 upward (i.e., increased), thereby causing the control valve or valves to close and circulate less cooling fluid to the cooling apparatus 612.

Figure 7:
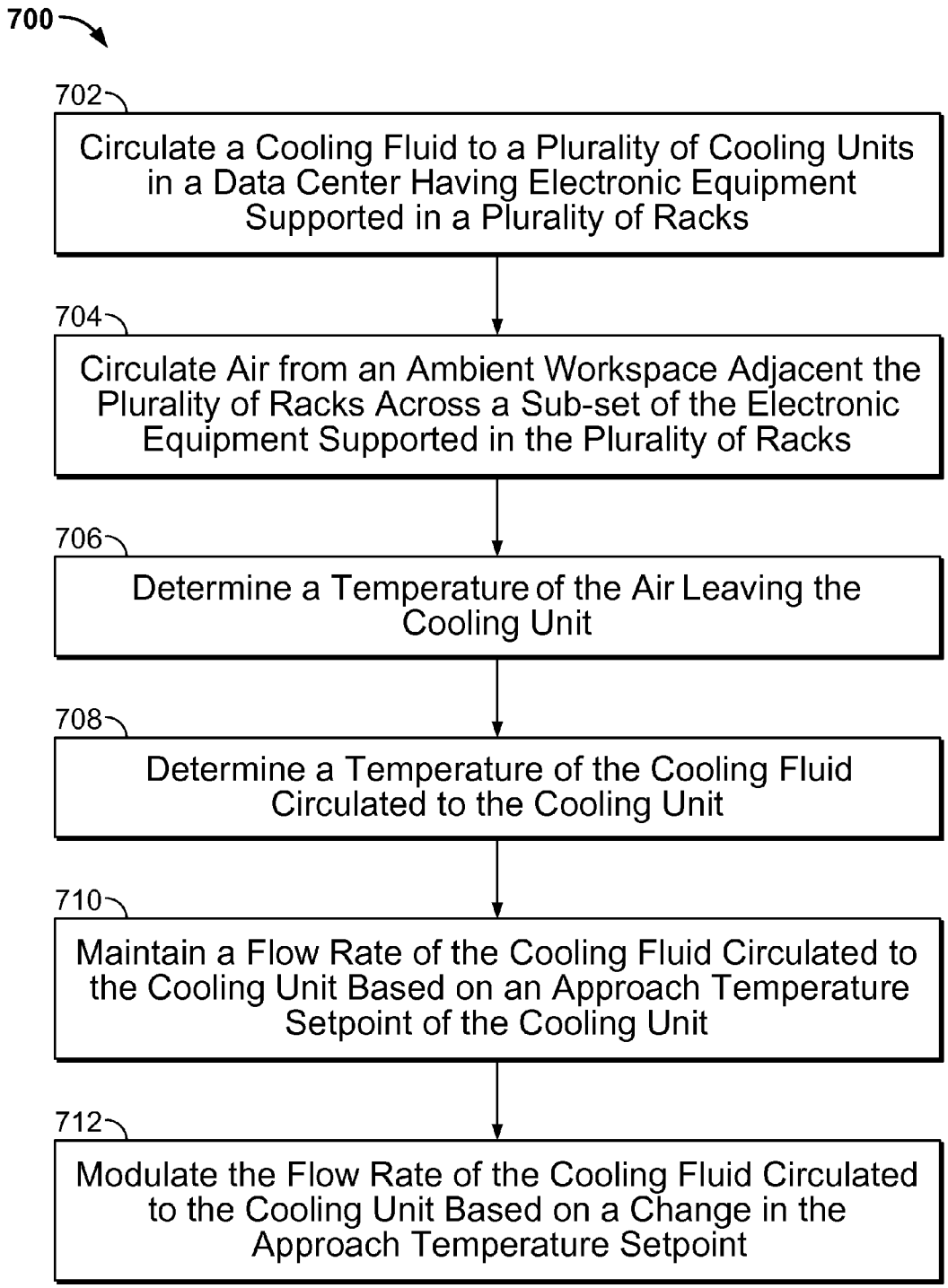
FIG. 7 illustrates an example process for cooling a data center based on an approach temperature.

FIG. 7 illustrates an example process 700 for cooling a data center based on an approach temperature. Process 700 may be implemented, for example, by or with a cooling system for a data center, such as, for example, the cooling systems 100 and/or 500 illustrated in FIGS. 1 and 5, respectively, as well as a cooling system including the cooling unit 16, the cooling unit 200, or other cooling unit in accordance with the present disclosure.

Process 700 may begin at step 702, when a cooling fluid is circulated to multiple cooling units in a data center having electronic equipment supported in multiple racks. The racks, in some embodiments, may be in the form of open bays (e.g., open at front and back sides to an ambient workspace and warm air plenum, respectively). The racks may therefore be serviceable from one or both of the front or back sides during operation (e.g., while cooling airflow is circulated through the racks) of the racks and cooling system. In some embodiments, the cooling fluid may be a chilled liquid, such as water, glycol, ammonia, or another liquid. In some embodiments, the cooling fluid may be a cool liquid, such as a condenser water flow from, for example, a cooling tower, an evaporative cooling tower, a chiller condenser, or other condenser. In some embodiments, the cooling fluid may be a mixed flow of, for example, chilled water supplied from a cooling plant and chilled water returned to a cooling plant.

In step 704, air is circulated from an ambient workspace adjacent the racks across a sub-set of the electronic equipment supported in the racks. In some embodiments, air may be circulated through the racks by one or more fans of the cooling units. Alternatively, or in addition, air may be circulated over the racks (at least partially) by one or more air moving devices mounted on or adjacent computer servers in the racks.

In step 706, a temperature of the air leaving the cooling unit (i.e., leaving air temperature or "LAT") is determined. Measurement of the air leaving the cooling unit may be via, for example, a temperature sensor (e.g., thermocouple, digital sensor, analog sensor or otherwise) mounted at or near one or more fans of the cooling unit. In some embodiments, the air temperature may be measured at a leaving edge (i.e., a cold face) of one or more cooling coils of the cooling unit. In some embodiments, alternatively, the air temperature may be measure in the ambient workspace near the cooling unit.

In step 708, a temperature of the cooling fluid circulated to the cooling unit (i.e., entering fluid temperature or "EFT") is determined. In some embodiments, for example, a temperature sensor may be arranged in a cooling fluid supply conduit circulating the cooling fluid to one or more cooling coils of the cooling unit. In some embodiments, a difference between the LAT and EFT may be defined as an approach temperature of the cooling unit. For example, in some embodiments, the LAT may be approximately 78° F. while the EFT may be approximately 55° F., providing for an approach temperature of 22° F. However, in other embodiments, the EFT may be approximately 64° F., providing for an approach temperature of 14° F. In some embodiments, the approach temperature of the cooling unit may be set to a particular value, e.g., about 14° F., in order to maximize an efficiency of the cooling unit. Further, in some embodiments, a data center with multiple cooling units may have a single approach temperature set point for all of the cooling units, a unique approach temperature set point for each cooling unit, and/or unique approach temperature set points for groups of cooling units among the multiple cooling units in the data center. By having unique approach temperature set points for each cooling unit or a group of cooling units, an amount of cooling fluid available to the cooling units of the data center (e.g., pumped from one or more central cooling plants) may be maximized.

In step 710, a flow rate of the cooling fluid circulated to the cooling unit based on an approach temperature set point of the cooling unit is maintained. For example, in some embodiments, as the cooling unit operates to provide cooling air to the data center and electronic equipment in the racks, a control valve disposed in the cooling fluid supply conduit to the cooling unit may be modulated help meet the approach temperature set point. For example, a controller of the control valve may automatically modulate the valve so that the approach temperature set point is maintained.

In step 712, the flow rate of the cooling fluid circulated to the cooling unit is modulated based on a change in the approach temperature set point. For example, in some embodiments (some of which are described more fully with reference to FIGS. 8-9), the approach temperature to the cooling unit may be adjusted according to, for example, outside weather temperature, data center environmental conditions, and/or available or instantaneous cooling requirements/capacity, to name but a few. For example, in some embodiments, a controller (e.g., a main controller communicably coupled to individual controllers coupled to control valves of the cooling units) may monitor a percentage open position of the control valves of respective cooling units in the data center.

The controller may monitor the positions of the valves to determine whether a predetermined percentile valve (e.g., the 95$^{th}$ percentile valve within the multiple control valves associated with cooling units in the data center) are at a predetermined position (e.g., about 95% open). If, for example, the 95th percentile valve is only at 75% open, then the approach temperature set point may be lowered (i.e., decreased). By lowering the set point, for instance, the 95$^{th}$ percentile control valve may be modulated toward a fully open position. Alternatively, all or a group of the control valves may be modulated toward an open position when the approach temperature set point is adjusted downward until the 95th percentile valve reaches about 95% open. Thus, more cooling fluid would be circulated to one or more of the cooling units, thereby making the LAT decrease as it is circulated through the cooling unit.

If, for example, the 95th percentile valve is at 100% open, then the approach temperature set point may be raised (i.e., increased). By raising the set point, for instance, the $95^{th}$ percentile control valve may be modulated toward a fully closed position (i.e., towards about 95% open). Alternatively, all or a group of the control valves may be modulated away from an open position when the approach temperature set point is adjusted upward until the $95^{th}$ percentile valve reaches about 95% open. Less cooling fluid would be circulated to one or more of the cooling units, thereby making the LAT increase as it is circulated through the cooling unit.

Figure 8:
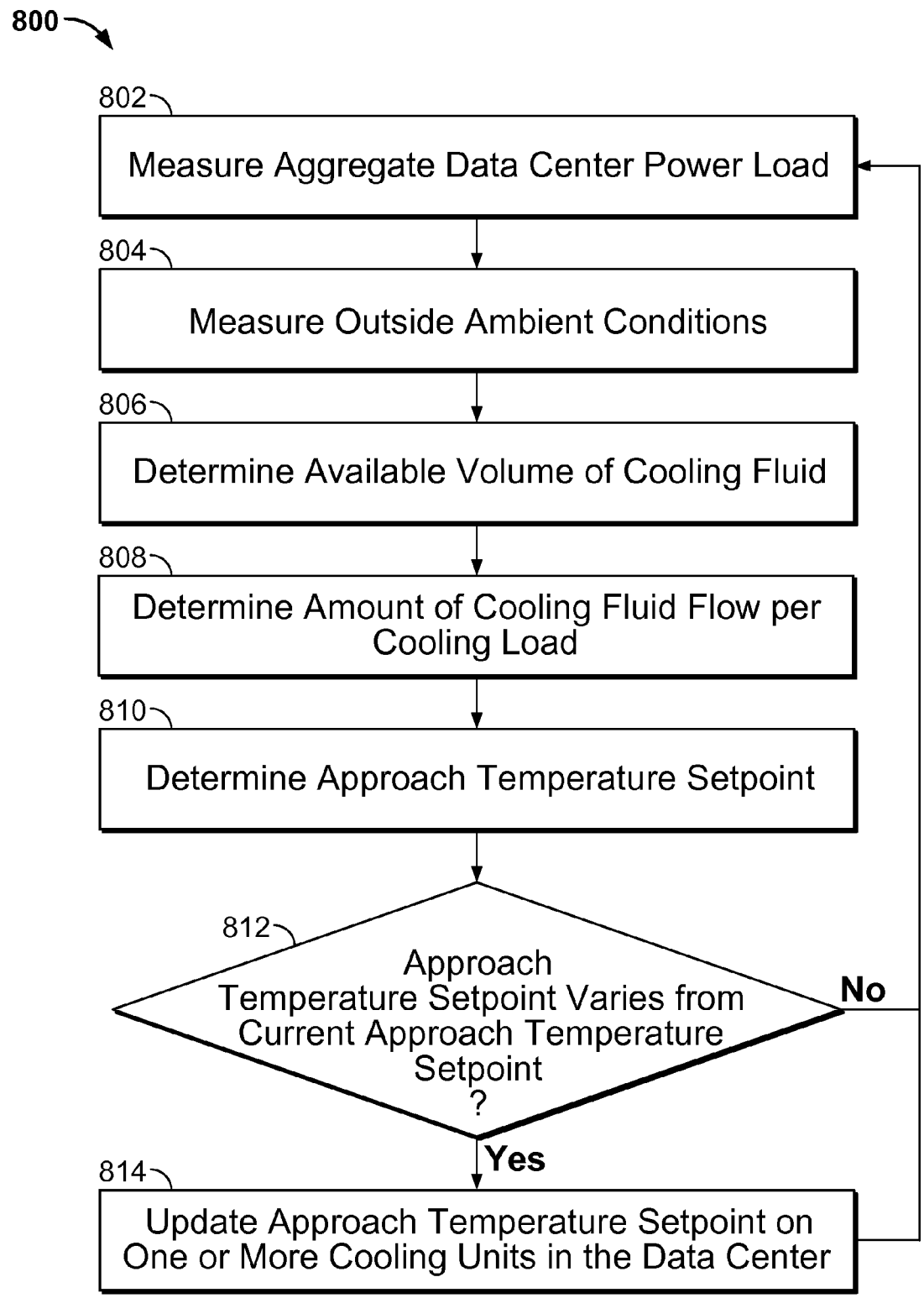
FIGS. 8-9 illustrate example processes for adjusting an approach temperature to cool a data center.
Figure 9:
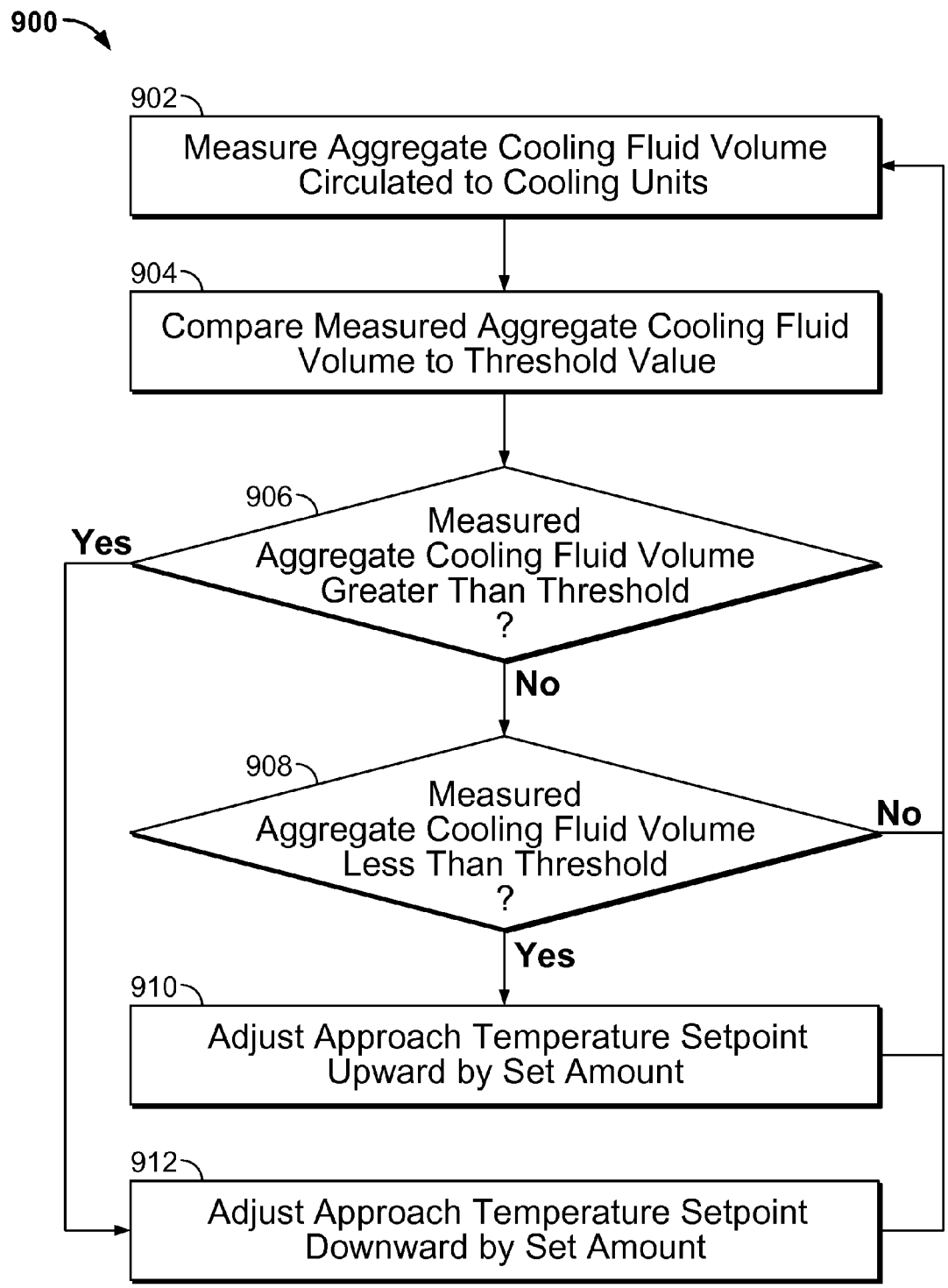

FIGS. 8-9 illustrate example processes 800 and 900, respectively, for adjusting an approach temperature to cool a data center. Turning to FIG. 8, process 800 may be implemented, for example, by or with a cooling system for a data center, such as, for example, the cooling systems 100 and/or 500 illustrated in FIGS. 1 and 5, respectively, as well as a cooling system including the cooling unit 16, the cooling unit 200, or other cooling unit in accordance with the present disclosure. Further, process 800 may be implemented in addition with, or alternatively to, one or more processes to adjust an approach temperature set point as described with reference to FIG. 6 or 7 above.

In step 802, an aggregate data center power load is measured. For example, the aggregate data center power load may represent an amount of electrical power used by electrical equipment (e.g., servers in racks) in the data center.

In step 804, outside ambient conditions may be measured. In some embodiments, an outside temperature, humidity, and/or enthalpy of the environment outside of a data center may be measured. For instance, such outside ambient conditions may determine, at least partially, a cooling load on the data center along with the amount of electrical power used by the electrical equipment. The outside ambient conditions may, for instance, determine an external cooling load on the data center due to infiltration, conduction through the structure, and/or exhaust/outside air requirements (e.g., set by ASHRAE standards). The amount of electrical power used by the electrical equipment may determine an internal cooling load on the data center. The sum of the internal and external cooling loads may determine at least an approximate amount of total cooling load on the data center. The total cooling load may be provided by the cooling units in the data center, which circulate cool air to the workspace and racks to alleviate the cooling load. Heat in the data center due to the total cooling load is transferred to the cooling fluid circulated to the cooling units In step 806, an available volume of cooling fluid is determined. The available volume of cooling fluid may be, for example, a maximum amount of volumetric flow (e.g., gallons per minute) of cooling fluid that may be circulated to the cooling units of the data center. This may be determined, for example, by reference to a maximum pumping capacity of one or more pumps circulating the cooling fluid, a measured maximum flow rate through a cooling fluid delivery system (e.g., by a flow meter installed in a cooling fluid conduit, such as the flow meter 150 illustrated in FIG. 1B), or otherwise.

In step 808, an amount of cooling fluid per unit of cooling load is determined. In some embodiment, the cooling load may include a total cooling load or, alternatively, a cooling load from the electronic equipment in the racks of the data center. Thus, in some embodiment, the amount of cooling fluid per unit of cooling load may be an amount of cooling fluid (e.g., GPM) per electrical power converted to heat by the electronic equipment (e.g., kW).

In step 810, the approach temperature set point is determined according to, for example, the determined cooling fluid per unit of cooling power. For instance, in some embodiments, the approach temperature set point is determined based on a particular airside temperature between (e.g. midway between or otherwise) a maximum allowable temperature of the ambient air 24 and a minimum allowable temperature of the ambient air 24 and a fluid side temperature about equal to a nominal entering fluid temperature (e.g., the cooling fluid supply 32).

In step 812, a determination is made whether the determined approach temperature set point varies from, for example, a current approach temperature set point. As another example, it may be determined whether the determined approach temperature set point varies from a predetermined approach temperature set point. If the determination is made that the determined approach temperature set point does not vary from the current approach temperature set point and/or predetermined temperature set point, then the process 800 returns to step 800. If the determination is made that the determined approach temperature set point does vary from the current approach temperature set point and/or predetermined temperature set point, then at step 814, the approach temperature set point on one or more cooling units in the data center is updated (e.g., through a main controller coupled to controllers of control valves associated with respective cooling units). Process 800 may return to step 802.

Turning to FIG. 9, process 900 may be implemented, for example, by or with a cooling system for a data center, such as, for example, the cooling systems 100 and/or 500 illustrated in FIGS. 1 and 5, respectively, as well as a cooling system including the cooling unit 16, the cooling unit 200, or other cooling unit in accordance with the present disclosure. Further, process 900 may be implemented in addition with, or alternatively to, one or more processes to adjust an approach temperature set point as described with reference to FIG. 6 or 7 above.

At step 902, an aggregate cooling fluid volume circulated to cooling units in a data center is measured. In some embodiments, for example, a flow meter (e.g., mechanical flow meter such as a turbine flow meter, pressure-based flow meter such as a venture, or another type of flow meter) may be located in a main conduit for circulating fluid to all or most of the cooling units in the data center to measure the aggregate cooling fluid volume. In some embodiments, a relative speed (e.g., RPM) of a pump circulating the cooling fluid through the main conduit may be measured to determine a volumetric flow of cooling fluid delivered to the cooling units (e.g., by reference to a pump curve). In some embodiments, flow meters may be associated with respective cooling units and flow rates of cooling fluid delivered to the cooling units may be measured and aggregated, for example, via a main controller of the cooling system for the data center.

In some embodiments, the cooling fluid may be circulated to the cooling units at a flow rate to maintain a predetermined approach temperature at the cooling units (e.g., a difference between a leaving air temperature from the cooling unit and an entering cooling fluid temperature to the cooling unit). For example, each cooling unit may have an associated control valve that modulates to maintain the specified approach temperature set point. In some embodiments, each cooling unit in the data center may have the same approach temperature set point. In some embodiments, each cooling unit may be controlled to a unique approach temperature set point. In still further embodiments, particular groups of cooling units may be controlled (e.g., by modulating the control valve associated with each cooling unit) according to a particular approach temperature set point.

In step 904, the measured aggregate cooling fluid volume is compared against a threshold value. For example, in some embodiments, the measured volume (or volumetric flow rate value) is compared to a pre-stored value by a main controller of the data center cooling system. In step 906, a determination is made whether the measured aggregate cooling fluid volume is greater than the threshold value. If the measured aggregate cooling fluid volume is greater than the threshold value, then the approach temperature set point is adjusted downward (i.e., decreased) by a set amount (e.g., 1° C., 0.5° C., 0.25° C., 2° C., or other value). The resultant action, in some embodiments, may be that one or more of the control valves may be modulated toward an open position, thereby allowing more cooling fluid to circulate to the cooling units. This may, in turn, allow the leaving air temperature to approach the entering cooling fluid temperature. The process 900 may then return to step 902.

If the measured aggregate cooling fluid volume is not greater than the threshold value, then a determination is made whether the measured aggregate cooling fluid volume is less than the threshold value in step 908. If the measured aggregate cooling fluid volume is less than the threshold value, then the approach temperature set point is adjusted upward (i.e., increased) by a set amount (e.g., 1° C., 0.5° C., 0.25° C., 2° C., or other value). The resultant action, in some embodiments, may be that one or more of the control valves may be modulated toward a closed position, thereby allowing less cooling fluid to circulate to the cooling units. This may, in turn, allow the leaving air temperature to depart from the entering cooling fluid temperature. The process 900 may then return to step 902.

A number of implementations have been described. Nevertheless, it will be understood that various modifications may be made. For example, various combinations of the components described herein may be provided for embodiments of similar apparatuses. Further, in some example embodiments of the cooling apparatus described herein, a liquid-to-liquid heat exchanger may be included in addition to or in place of a fan and liquid-to-air heat exchanger in order to cool electronic equipment supported in one or more racks. For instance, the liquid-to-liquid heat exchanger may receive heat from the electronic equipment into a working liquid and transfer the heat to a cooling fluid. Accordingly, other implementations are within the scope of the present disclosure.

What is claimed is:

1. A data center cooling system, comprising:
a data center having electronic equipment that is supported in a plurality of racks;
a cooling fluid source;
a plurality of cooling units in the data center, each cooling unit configured to cool air warmed by a sub-set of the electronic equipment in the data center;
a plurality of control valves, including a particular control valve associated with a particular cooling unit of the plurality of cooling units; and
a controller arranged to modulate the particular control valve associated with a particular cooling unit, to open or close the control valve to substantially maintain an approach temperature set point of the particular cooling unit, wherein the approach temperature is defined by a difference between a temperature of an airflow circulated from the cooling unit and a temperature of the cooling fluid source circulated to the particular cooling unit, and wherein the controller is arranged to receive a signal adjusting the approach temperature set point, wherein the controller is one of a plurality of controllers, each of the plurality of controllers associated with one of the plurality of cooling units, where the controller is arranged to modulate the particular control valve based on receipt of a signal adjusting the approach temperature set point based, at least in part, on the particular control valve being at a percentage open position that varies from a threshold percentage open setpoint.

2. The data center cooling system of claim 1, wherein the controller is arranged to modulate the control valve to open the control valve based on the controller receiving the signal adjusting the approach temperature set point.

3. The data center cooling system of claim 1, wherein the controller is arranged to modulate the plurality of control valves to open the plurality of control valves until about 98% of the plurality of control valves are about 95% open.

4. The data center cooling system of claim 1, further comprising:
an airflow temperature sensor arranged to measure the temperature of the airflow as it leaves the particular cooling unit; and
a fluid temperature sensor arranged to measure a temperature of the cooling fluid source as it enters the particular cooling unit.

5. The data center cooling system of claim 1, wherein the particular cooling unit comprises one or more cooling coils that receive the circulating cooling fluid.

6. The data center cooling system of claim 5, wherein each cooling unit comprises one or more fans arranged to circulate air from an ambient workspace adjacent a row of racks, through front sides of the racks open to the workspace, through back sides of the racks opposite the front sides, and to the cooling unit.

7. The data center cooling system of claim 6, wherein the one or more fans are arranged to circulate the air through the racks to receive heat generated by the electronic equipment, and
wherein the one or more fans are arranged to circulate the heated air through the cooling coils to transfer the heat generated by the electronic equipment to the circulating cooling fluid and to expel the air to the ambient workspace.

8. The data center cooling system of claim 6, wherein the one or more fans of the particular cooling unit are arranged to circulate air from the ambient workspace through the front sides of at least two adjacent racks in the row of racks, through the back sides of the two racks opposite the front sides, and to the particular cooling unit.

9. The data center cooling system of claim 6, further comprising a fan controller arranged to vary a speed of the one or more fans in response to the signal adjusting the approach temperature set point.

10. The data center cooling system of claim 1, wherein the racks are in rows, and the cooling units are positioned on a support floor of the data center between pairs of adjacent rows.

11. The data center cooling system of claim 1, wherein the signal to adjust approach temperature is based on an amount of cooling fluid flow that is required to meet a cooling load in the data center.

12. The data center cooling system of claim 1, wherein the signal to adjust approach temperature is based on an aggregate amount of cooling fluid circulated to the plurality of cooling units.

13. The data center cooling system of claim 12, wherein the controller is configured to decrease the approach temperature set point based on the aggregate amount of cooling fluid below a threshold amount, and increase the approach temperature set point based on the aggregate amount above a threshold amount.

14. The data center cooling system of claim 1, wherein each control valve associated with a cooling unit of the plurality of cooling units is modulated to maintain a unique approach temperature set point associated with the cooling unit.

15. The data center cooling system of claim 1, wherein each cooling unit comprises a liquid-to-liquid heat exchanger comprising a working fluid in heat transfer communication with the cooling fluid source, the working fluid operable to cool air warmed by the sub-set of the electronic equipment in the data center.

16. The data center cooling system of claim 1, wherein the particular valve is selected from the plurality of control valves based on a flow rate of the cooling fluid source.

17. A method for cooling a data center, the method comprising:
circulating a cooling fluid, through a plurality of control valves, to a plurality of cooling units in a data center that contains electronic equipment that is supported in a plurality of racks;
circulating air from an ambient workspace that is adjacent the plurality of racks, across a sub-set of the electronic equipment that is supported in the plurality of racks, through a particular cooling unit of the plurality of cooling units, and from the particular cooling unit to the ambient workspace;
determining a temperature of the air leaving the particular cooling unit;
determining a temperature of the cooling fluid circulated to the particular cooling unit;
modulating a flow rate of the cooling fluid circulated through a particular control valve to the particular cooling unit to maintain an approach temperature set point of the particular cooling unit, wherein the approach temperature is defined using a difference between the temperature of the air leaving the particular cooling unit and the temperature of the cooling fluid circulated to the particular cooling unit;
modulating the flow rate of the cooling fluid circulated to the particular cooling unit based on a change in the approach temperature set point that is received from a control system;
varying a rate of the air circulated from the particular cooling unit to the ambient workspace in response to the change in the approach temperature set point; and
modulating the particular control valve based on receipt of a signal adjusting the approach temperature set point based, at least in part, on the particular control valve being at a percentage open position that varies from a threshold percentage open setpoint.

18. The method of claim 17, wherein modulating the flow rate of the cooling fluid circulated to the particular cooling unit comprises modulating a control valve associated with the particular cooling unit to open or close the control valve with a controller.

19. The method of claim 17, further comprising receiving a signal at the controller that represents the change in the approach temperature set point.

20. The method of claim 17, further comprising modulating a plurality of control valves associated with the plurality of cooling units to open the plurality of control valves until about 98% of the plurality of control valves are about 95% open.

21. The method of claim 17, further comprising:
circulating air warmed by the sub-set of electronic equipment through one or more cooling coils of the particular cooling unit; and
circulating cool air from the one or more cooling coils to the ambient workspace.

22. The method of claim 17, further comprising:
determining a cooling load of the data center; and
adjusting the approach temperature set point to meet the cooling load in the data center.

23. The method of claim 17, wherein the signal to adjust approach temperature is based on an aggregate amount of cooling fluid circulated to the plurality of cooling units.

24. The method of claim 23, wherein the controller is configured to decrease the approach temperature set point based on the aggregate amount below a threshold amount, and increase the approach temperature set point based on the aggregate amount above a threshold amount.

25. The method of claim 17, wherein each control valve associated with a cooling unit of the plurality of cooling units is modulated to maintain a unique approach temperature set point associated with the cooling unit.

26. The method of claim 17, wherein the particular valve is selected from the plurality of control valves based on a flow rate of the cooling fluid source.

27. A data center cooling system, comprising:
a computer rack that supports a plurality of heat-generating devices;
a fan coil unit arranged adjacent to the computer rack and comprising:
at least one fan arranged to circulate air from an open front side of the computer rack adjacent a human-occupiable workspace through the rack and to an open back side of the computer rack adjacent the fan coil unit; and
at least one cooling coil adjacent the open back side of the computer rack and arranged to receive heated air circulated from the computer rack and cool the heated air;
a control valve configured to control a volumetric flow of cooling fluid circulated to the cooling coil;
a unit controller communicably coupled to the control valve and configured to modulate the valve to meet an approach temperature set point of the fan coil unit, wherein an approach temperature is a difference between a leaving air temperature of the fan coil unit and an entering cooling fluid temperature of the fan coil unit, wherein the approach temperature set point is varied based on an open percentage of the modulating valve; and
a main controller communicably coupled to the unit controller, and the main controller is operable to receive a signal representative of the open percentage of the control valve, and in response to the signal, transmit a command to the unit controller to vary the approach temperature set point, where the unit controller is operable to receive a signal from the main controller adjusting the approach temperature set point based, at least in part, on the control valve being at a percentage open position that varies from a threshold percentage open setpoint.

28. The data center cooling system of claim 27, wherein the main controller is operable to determine an available amount of the cooling fluid from a central cooling plant, and based on the determined available amount and the signal representative of the open percentage of the control valve, transmit a second command to the unit controller to vary the approach temperature set point.

29. The data center cooling system of claim 27, wherein the main controller is operable to compare the signal representative of the open percentage of the control valve to a predetermined percentage, and based on a variance in the signal and the predetermined percentage, transmit a second command to the unit controller to vary the approach temperature set point.

30. The data center cooling system of claim 27, wherein the main controller is operable to compare a plurality of signals representative of open percentages of a plurality of control valves to a predetermined percentage, and based on a variance between an aggregation of the plurality of signals and the predetermined percentage, transmit a second command to the unit controller to vary the approach temperature set point.

31. A data center cooling system, comprising:
a data center having electronic equipment that is supported in a plurality of racks;
a cooling fluid source;
a plurality of cooling units in the data center, each cooling unit configured to cool air warmed by a sub-set of the electronic equipment in the data center;
a plurality of control valves, including a particular control valve associated with a particular cooling unit of the plurality of cooling units; and
a controller arranged to modulate the particular control valve associated with a particular cooling unit, to open or close the control valve to substantially maintain an approach temperature set point of the particular cooling unit, wherein the approach temperature is defined by a difference between a temperature of an airflow circulated from the cooling unit and a temperature of the cooling fluid source circulated to the particular cooling unit, and wherein the controller is arranged to receive a signal adjusting the approach temperature set point, wherein the controller is one of a plurality of controllers, each of the plurality of controllers associated with one of the plurality of cooling units, wherein the controller is arranged to modulate the plurality of control valves to open the plurality of control valves until about 98% of the plurality of control valves are about 95% open.

32. A data center cooling system, comprising:
a data center having electronic equipment that is supported in a plurality of racks;
a cooling fluid source;
a plurality of cooling units in the data center, each cooling unit configured to cool air warmed by a sub-set of the electronic equipment in the data center;
a plurality of control valves, including a particular control valve associated with a particular cooling unit of the plurality of cooling units; and
a controller arranged to modulate the particular control valve associated with a particular cooling unit, to open or close the control valve to substantially maintain an approach temperature set point of the particular cooling unit, wherein the approach temperature is defined by a difference between a temperature of an airflow circulated from the cooling unit and a temperature of the cooling fluid source circulated to the particular cooling unit, and wherein the controller is arranged to receive a signal adjusting the approach temperature set point, wherein the controller is one of a plurality of controllers, wherein the particular valve is selected from the plurality of control valves based on a flow rate of the cooling fluid source.

33. A method for cooling a data center, the method comprising:
circulating a cooling fluid, through a plurality of control valves, to a plurality of cooling units in a data center that contains electronic equipment that is supported in a plurality of racks;
circulating air from an ambient workspace that is adjacent the plurality of racks, across a sub-set of the electronic equipment that is supported in the plurality of racks, through a particular cooling unit of the plurality of cooling units, and from the particular cooling unit to the ambient workspace;
determining a temperature of the air leaving the particular cooling unit;
determining a temperature of the cooling fluid circulated to the particular cooling unit;
modulating a flow rate of the cooling fluid circulated through a particular control valve to the particular cooling unit to maintain an approach temperature set point of the particular cooling unit, wherein the approach temperature is defined using a difference between the temperature of the air leaving the particular cooling unit and the temperature of the cooling fluid circulated to the particular cooling unit;
modulating the flow rate of the cooling fluid circulated to the particular cooling unit based on a change in the approach temperature set point that is received from a control system;
varying a rate of the air circulated from the particular cooling unit to the ambient workspace in response to the change in the approach temperature set point; and
modulating a plurality of control valves associated with the plurality of cooling units to open the plurality of control valves until about 98% of the plurality of control valves are about 95% open.

34. A method for cooling a data center, the method comprising:
circulating a cooling fluid, through a plurality of control valves, to a plurality of cooling units in a data center that contains electronic equipment that is supported in a plurality of racks;
circulating air from an ambient workspace that is adjacent the plurality of racks, across a sub-set of the electronic equipment that is supported in the plurality of racks, through a particular cooling unit of the plurality of cooling units, and from the particular cooling unit to the ambient workspace;
determining a temperature of the air leaving the particular cooling unit;
determining a temperature of the cooling fluid circulated to the particular cooling unit;
modulating a flow rate of the cooling fluid circulated through a particular control valve to the particular cooling unit to maintain an approach temperature set point of the particular cooling unit, wherein the approach temperature is defined using a difference between the temperature of the air leaving the particular cooling unit and the temperature of the cooling fluid circulated to the particular cooling unit, and the particular valve is selected from the plurality of control valves based on a flow rate of the cooling fluid source;
modulating the flow rate of the cooling fluid circulated to the particular cooling unit based on a change in the approach temperature set point that is received from a control system; and
varying a rate of the air circulated from the particular cooling unit to the ambient workspace in response to the change in the approach temperature set point.

* * * * *